(12) United States Patent
Ichiyama et al.

(10) Patent No.: US 8,204,165 B2
(45) Date of Patent: Jun. 19, 2012

(54) JITTER MEASUREMENT APPARATUS, ELECTRONIC DEVICE, AND TEST APPARATUS

(75) Inventors: Kiyotaka Ichiyama, Tokyo (JP); Masahiro Ishida, Tokyo (JP)

(73) Assignee: Advantest Corporation, Tokyo (JP)

(*) Notice: Subject to any disclaimer, the term of this patent is extended or adjusted under 35 U.S.C. 154(b) by 1084 days.

(21) Appl. No.: 11/616,038

(22) Filed: Dec. 26, 2006

(65) Prior Publication Data
US 2007/0211795 A1    Sep. 13, 2007

Related U.S. Application Data

(63) Continuation-in-part of application No. 11/371,849, filed on Mar. 10, 2006, now Pat. No. 7,554,332.

(51) Int. Cl.
*H04L 7/00* (2006.01)
(52) U.S. Cl. .............. 375/354; 370/503; 704/270.1
(58) Field of Classification Search ............. 370/503; 375/375; 704/270.1; 713/375–601; 714/12
See application file for complete search history.

(56) References Cited

U.S. PATENT DOCUMENTS

| | | | | |
|---|---|---|---|---|
| 5,365,346 | A * | 11/1994 | Abumi | 348/708 |
| 6,876,219 | B2 * | 4/2005 | Vollrath | 324/765 |
| 7,558,991 | B2 * | 7/2009 | Mattes et al. | 714/700 |
| 2003/0018442 | A1 | 1/2003 | Yamaguchi et al. | |
| 2003/0142517 | A1 * | 7/2003 | Furukawa et al. | 363/37 |
| 2004/0022151 | A1 * | 2/2004 | Furumiya et al. | 369/47.53 |
| 2004/0146101 | A1 * | 7/2004 | Pearce | 375/238 |
| 2005/0074081 | A1 * | 4/2005 | Danzig et al. | 375/355 |
| 2005/0149784 | A1 | 7/2005 | Ishida et al. | |
| 2005/0179576 | A1 | 8/2005 | Tarui et al. | |
| 2006/0132231 | A1 * | 6/2006 | Ishii et al. | 330/10 |
| 2007/0118314 | A1 * | 5/2007 | Ichiyama et al. | 702/69 |
| 2008/0151585 | A1 * | 6/2008 | Kayano | 363/65 |
| 2008/0315943 | A1 * | 12/2008 | Underhill | 327/552 |

FOREIGN PATENT DOCUMENTS

| | | |
|---|---|---|
| DE | 10393446 T5 | 9/2005 |
| EP | 1508813 A1 | 2/2005 |
| JP | 2004-013273 | 1/1992 |
| JP | 2006-342042 | 12/1994 |
| JP | 2001-141767 | 5/2001 |
| JP | 2003179142 A | 6/2003 |

(Continued)

OTHER PUBLICATIONS

German Patent and Trademark Office. German Application No. 11 2007 000 506.8-35. Name of Applicant: Advantest Corporation. Office Action dated Feb. 26, 2010. English Language Translation. 17 pages.

(Continued)

*Primary Examiner* — David C. Payne
*Assistant Examiner* — Erin File
(74) *Attorney, Agent, or Firm* — Sterne, Kessler, Goldstein & Fox PLLC

(57) ABSTRACT

There is provided a jitter measurement apparatus to measure jitter of a signal under measurement. The jitter measurement apparatus includes a pulse generator that outputs a demodulated signal indicating the jitter of the signal under measurement, by outputting a pulse having a substantially constant pulse width in synchronization with each predetermined edge of the signal under measurement, a DC component detecting section that detects a DC component of the demodulated signal output from the pulse generator, and an adjusting section that adjusts the pulse width of the pulse output from the pulse generator, based on the DC component of the demodulated signal which is detected by the DC component detecting section.

11 Claims, 20 Drawing Sheets

FOREIGN PATENT DOCUMENTS

| | | |
|---|---|---|
| JP | 2004-125552 | 4/2004 |
| JP | 2004-226191 | 8/2004 |
| JP | 2006-003255 | 1/2006 |

OTHER PUBLICATIONS

German Patent and Trademark Office. German Application No. 11 2007 000 506.8-35. Name of Applicant: Advantest Corporation. Office Action dated Feb. 26, 2010. German Language. 13 pages.

Anderson, Christopher R. et al. Performance Analysis of a Time-Interleaved Sampling Architecture for a Software Defined Ultra Wideband Receiver. Mobile and Portable Radio Research Group. Virginia Polytechnical Institute and State University. Blackburg, Virginia. Proceeding of the SDR 05 Technical Conference and Product Exposition. Copyright © 2005 SDR Forum.

* cited by examiner

JITTER MEASUREMENT APPARATUS, ELECTRONIC DEVICE, AND TEST APPARATUS

CROSS REFERENCE TO RELATED APPLICATION

This application is a continuation-in-part of U.S. patent application Ser. No. 11/371,849, filed Mar. 10, 2006 now U.S. Pat. No. 7,554,332 and which is being incorporated in its entirety herein by reference.

BACKGROUND

1. Technical Field

The present invention relates to a jitter measurement apparatus, an electronic device and a test apparatus. More particularly, the present invention relates to a jitter measurement apparatus which adjusts a measurement gain.

2. Related Art

A jitter measurement apparatus is, for example, a device for converting jitter of a signal under measurement which is measured on the time axis into a voltage signal, and outputting the voltage signal. Here, the amount of jitter (variation in timing) of the signal under measurement is converted into the amount of voltage by using a conversion coefficient (a jitter gain) which is uniquely assigned to the jitter measurement apparatus. Considering this, the jitter gain of the jitter measurement apparatus is preferably known. If the jitter gain is known, the amount of jitter which is measured on the time axis can be obtained by dividing the voltage value output from the jitter measurement apparatus by the jitter gain.

The jitter gain of the jitter measurement apparatus can be obtained, for example, by using the following method. Before the signal under measurement is measured, a known amount of jitter is injected into a reference signal, the reference signal is then input into the jitter measurement apparatus, and the voltage value output from the jitter measurement apparatus is measured. The jitter gain of the jitter measurement apparatus can be estimated in advance based on the ratio between the measured voltage value and the known jitter amount.

However, if the jitter measurement apparatus is affected by PVT (process, voltage, temperature) variations while measuring the signal under measurement, the operational characteristics of the elements of the jitter measurement apparatus dynamically change. As a result, the jitter gain which is used for the measurement of the signal under measurement may be different from the jitter gain which is estimated before the measurement of the signal under measurement.

Furthermore, if a reference signal having a high frequency is input into the jitter measurement apparatus, the reference signal is degraded by, for example, the LC component of the transmission path from the outside of the jitter measurement apparatus to the measuring circuit disposed inside the jitter measurement apparatus. Such degradation causes a change in the known jitter amount of the reference signal input into the jitter measurement apparatus, thereby making it difficult to estimate an accurate jitter gain of the jitter measurement apparatus.

Since it is difficult to accurately estimate the jitter gain of the jitter measurement apparatus as discussed above, the jitter amount of the signal under measurement can not be accurately measured.

In view of the foregoing description, an advantage of some embodiments of the present invention is to provide a jitter measurement apparatus, an electronic device and a test apparatus which can solve the above-mentioned problems. This advantage is achieved by combining the features recited in the independent claims. The dependent claims define further effective specific example of the present invention.

SUMMARY

To solve the above-mentioned problems, a first embodiment of the present invention provides a jitter measurement apparatus to measure jitter of a signal under measurement. The jitter measurement apparatus includes a pulse generator that outputs a demodulated signal indicating the jitter of the signal under measurement, by outputting a pulse having a substantially constant pulse width in synchronization with each predetermined edge of the signal under measurement, a DC component detecting section that detects a DC component of the demodulated signal output from the pulse generator, and an adjusting section that adjusts the pulse width of the pulse output from the pulse generator, based on the DC component of the demodulated signal which is detected by the DC component detecting section.

A second embodiment of the present invention provides an electronic device having the jitter measurement apparatus of the first embodiment provided therein.

A third embodiment of the present invention provides an electronic device including therein a jitter measurement apparatus to measure jitter of a signal under measurement. The jitter measurement apparatus includes a pulse generator that outputs a demodulated signal indicating the jitter of the signal under measurement, by outputting a pulse having a substantially constant pulse width in synchronization with each predetermined edge of the signal under measurement, and a DC component detecting section that detects a DC component of the demodulated signal output from the pulse generator, and the electronic device includes an output terminal that outputs the DC component of the demodulated signal which is detected by the DC component detecting section, to an adjusting section that is provided outside the electronic device, and an input terminal that inputs a control signal output from the adjusting section into inside of the electronic device so as to adjust the pulse width of the pulse output from the pulse generator, the control signal being determined in accordance with a difference between a predetermined reference value and a level of the DC component of the demodulated signal.

Here, all the necessary features of the present invention are not listed in the summary. The sub-combinations of the features may become the invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
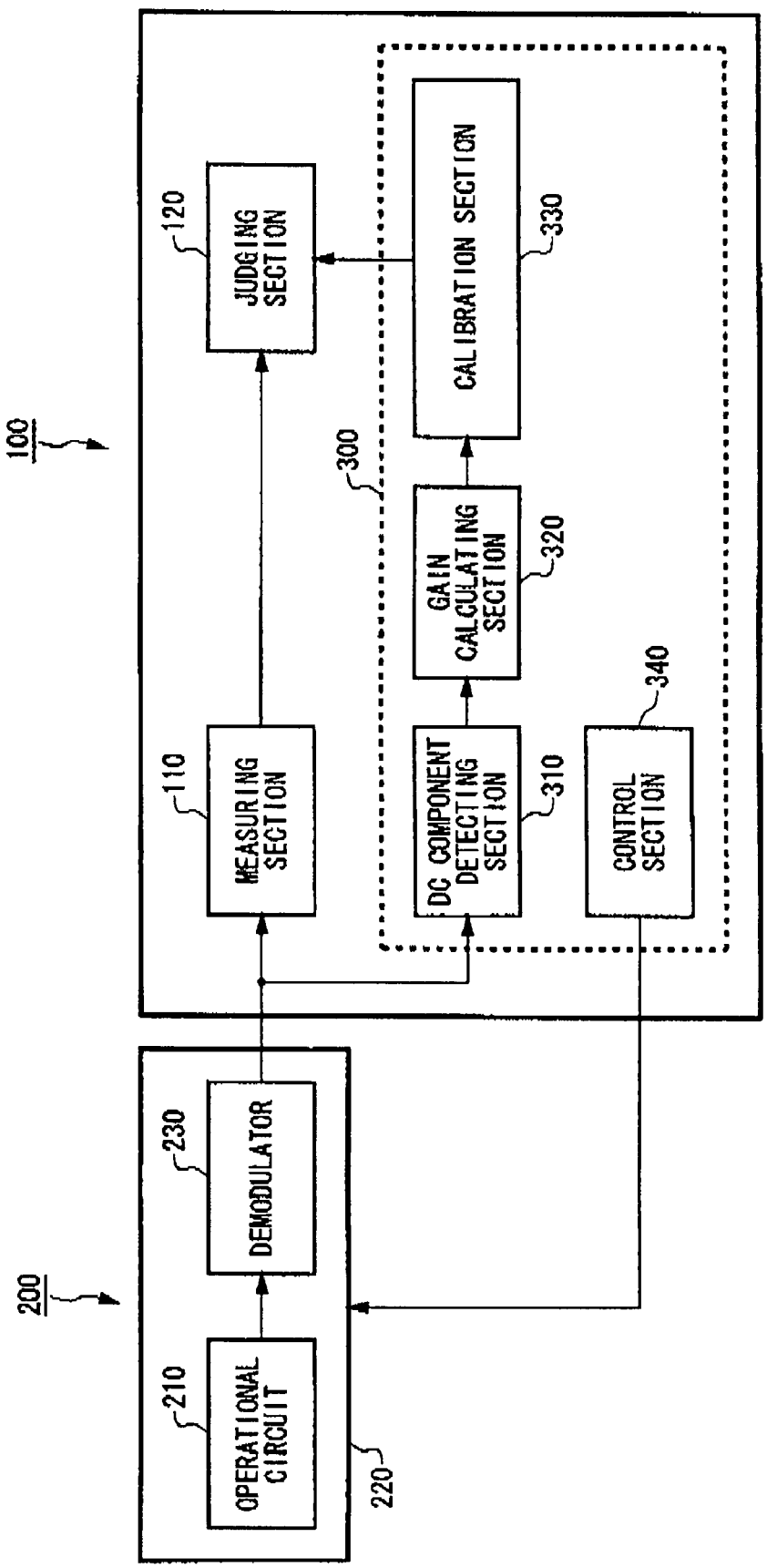
FIG. 1 shows, as one example, the configurations of a test apparatus 100 and an electronic device 200.

FIG. 1 shows, as one example, the configurations of a test apparatus 100 and an electronic device 200. The electronic device 200 is a semiconductor circuit or the like. The electronic device 200 generates a signal under measurement which is phase- or frequency-demodulated. The signal under measurement may be output to an external device from the electronic device 200, or transmitted within the electronic device 200. The test apparatus 100 judges the pass/fail of the electronic device 200 based on the signal under measurement.

The electronic device 200 includes therein an operational circuit 210, a demodulator 230 and a package section 220. The operational circuit 210 is the circuit to be evaluated or tested, and outputs an output signal based on a circuit operation. The operational circuit 210 may be a PLL circuit for generating a clock signal or one of logic and analog circuits for generating a different type of signal, for example.

The demodulator 230 receives the output signal from the operational circuit 210, generates a demodulated signal by extracting the phase- or frequency-modulation component of the output signal, and outputs the demodulated signal as the signal under measurement. For example, the demodulator 230 extracts a low-frequency modulation component from the output signal which has been generated by modulating a high-frequency carrier signal with the low-frequency modulation component.

The package section 220 has the operational circuit 210 and demodulator 230 provided therein. The package section 220 is made of ceramic, resin or the like, for example, and insulates the operational circuit 210 and demodulator 230 from outside. The package section 220 includes a terminal to electrically connect the inside with the outside of the electronic device 200. For example, the package section 220 may include a terminal for outputting the output signal generated by the operational circuit 210 and a terminal for outputting the signal generated by the demodulator 230. Alternatively, the package section 220 may include an output terminal shared by the operational circuit 210 and demodulator 230.

Configured in the above-described manner, the electronic device 200 can output a low-frequency signal under measurement as the modulation component. Therefore, even when the signal under measurement is measured outside the package section 220, the signal degradation is limited. As a result, the phase- or frequency-modulation component can be accurately measured.

The test apparatus 100 includes therein a measuring section 110, a judging section 120, and a calibration device 300. The measuring section 110 measures the modulation component based on the demodulated signal output from the electronic device 200. For example, the measuring section 110 may measure the modulation component by sampling the demodulated signal. The measuring section 110 may calculate the jitter amount of the output signal output from the operational circuit 210 based on the result of the sampling. In this case, the modulation component included in the output signal corresponds to the jitter component.

The judging section 120 judges the pass/fail of the electronic device 200 based on the result of the measurement done by the measuring section 110. For example, the judging section 120 may judge the pass/fail of the electronic device 200 based on the jitter amount measured by the measuring section 110.

The calibration device 300 performs calibration on the demodulator 230. Here, the demodulator 230 has a gain determined in accordance with the circuit characteristic between the input and output. Therefore, the demodulated signal input into the test apparatus 100 is equal to the result of multiplying the modulation component included in the output signal output from the operational circuit 210 by the gain of the demodulator 230. The calibration device 300 adjusts the gain of the demodulator 230 to a predetermined gain, so as to enable the measuring section 110 to accurately measure the modulation component.

The calibration device 300 includes therein a direct current (DC) component detecting section 310, a gain calculating section 320, a calibration section 330, and a control section 340. The DC component detecting section 310 detects the DC component of the demodulated signal output from the electronic device 200. For example, the DC component detecting section 310 may detect the average voltage of the demodulated signal as the DC component of the demodulated signal. Here, the demodulated signal, which is input into the measuring section 110, may be split and input into the DC component detecting section 310.

The gain calculating section 320 calculates the gain of the demodulator 230 based on the DC component detected by the DC component detecting section 310. The calibration section 330 performs calibration on the demodulator 230 based on the gain calculated by the gain calculating section 320. The calibration may be performed directly on the demodulator 230, or indirectly on the demodulator 230 in such a manner that the calibration section 330 corrects the value measured by the test apparatus 100 on the basis of the gain calculated by the gain calculating section 320.

The calibration section 330 relating to the present embodiment calculates a correction value by which the measured value of the demodulated signal is to be multiplied based on the gain, and notifies the calculated correction value to the judging section 120. For example, the calibration section 330 calculates an inverse of the gain as the correction value. The judging section 120 corrects the measured value obtained by the measuring section 110 based on the correction value, so as to reduce the influence of the gain of the demodulator 230.

Operating in the above-described manner, the test apparatus 100 can accurately measure the modulation component output from the operational circuit 210. Also, the test apparatus 100 can accurately test the electronic device 200.

The control section 340 controls the electronic device 200 to output the demodulated signal. For example, the electronic device 200 may output the output signal to an external device when operating, and output the demodulated signal to an external device when being tested. Here, the control section 340 causes the electronic device 200 to output the demodulated signal when the electronic device 200 is being tested.

Figure 2:
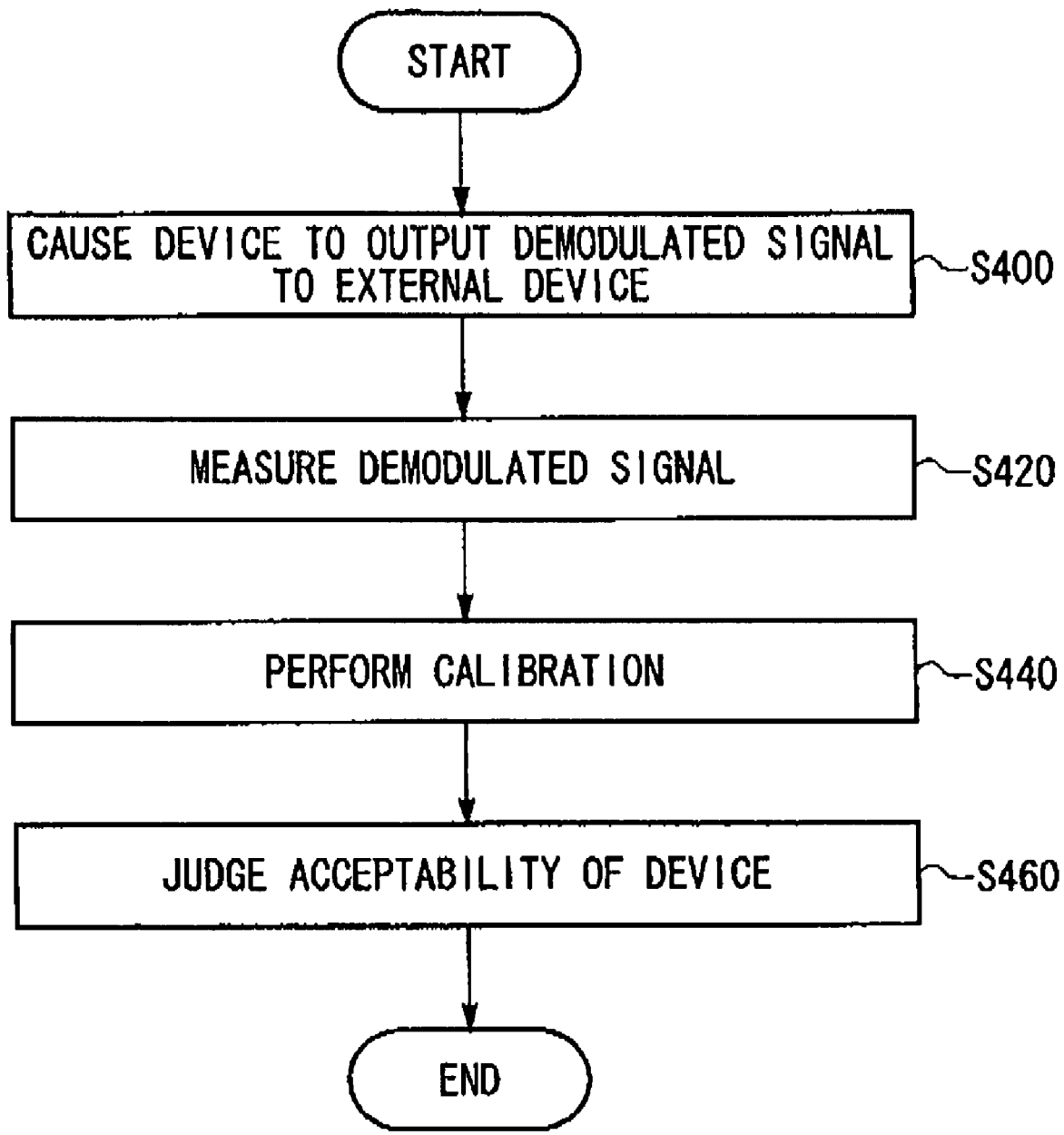
FIG. 2 shows one example of the operation performed by the test apparatus 100 illustrated with reference to FIG. 1.

FIG. 2 shows one example of the operation performed by the test apparatus 100 illustrated with reference to FIG. 1. In an output control step S400, the control section 340 causes the electronic device 200 to output the demodulated signal. In the following measuring step S420, the measuring section 110 measures the demodulated signal.

In the next calibration step S440, the calibration device 300 calculates the gain of the demodulator 230. The calibration device 300 also performs calibration based on the calculated gain. According to the present embodiment, the calibration device 300 calculates the gain based on the DC component of the demodulated signal. The calibration device 300 notifies a correction value determined based on the gain to the judging section 120.

In the subsequent judging step S460, the judging section 120 judges the pass/fail of the electronic device 200 based on the jitter amount, which is indicated by the demodulated signal, measured by the measuring section 110. For example, the judging section 120 may judge the pass/fail of the electronic device 200 by comparing the jitter amount measured by the measuring section 110 with a predetermined value used for the judgment.

Figure 3:
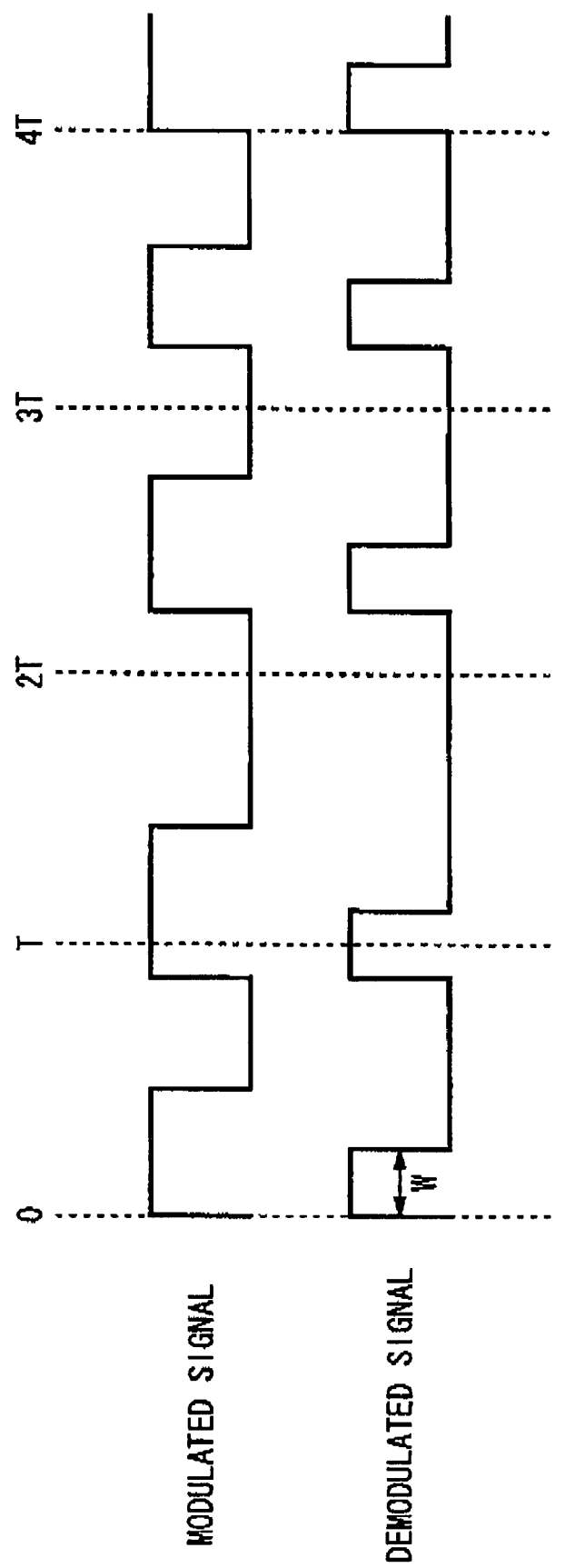
FIG. 3 shows, as one example, the waveform of an output signal input into a demodulator 230 and the waveform of a demodulated signal output from the demodulator 230.

FIG. 3 shows, as one example, the waveforms of the output signal input into the demodulator 230 and the demodulated signal output from the demodulator 230. Referring to the output signal, the timing of the pulse of each cycle is shifted with respect to a carrier cycle (0, T, 2T . . . ) because of frequency- or phase-modulation as shown in FIG. 3. It also should be noted that the time interval of each pulse is different.

The demodulator 230 outputs the demodulated signal by outputting a pulse having a predetermined pulse width W in synchronization with the edge of the output signal. According to the present embodiment, the demodulator 230 outputs such a pulse in synchronization with each rising edge of the output signal. The demodulator 230 may include therein a pulse generator for generating this pulse. Such a pulse generator can be easily configured by, for example, combining a delay circuit and a logic circuit. Operating in the above-described manner, the demodulator 230 generates the demodulated signal by extracting information regarding the positions of the edges of the output signal (modulation component).

Figure 4:
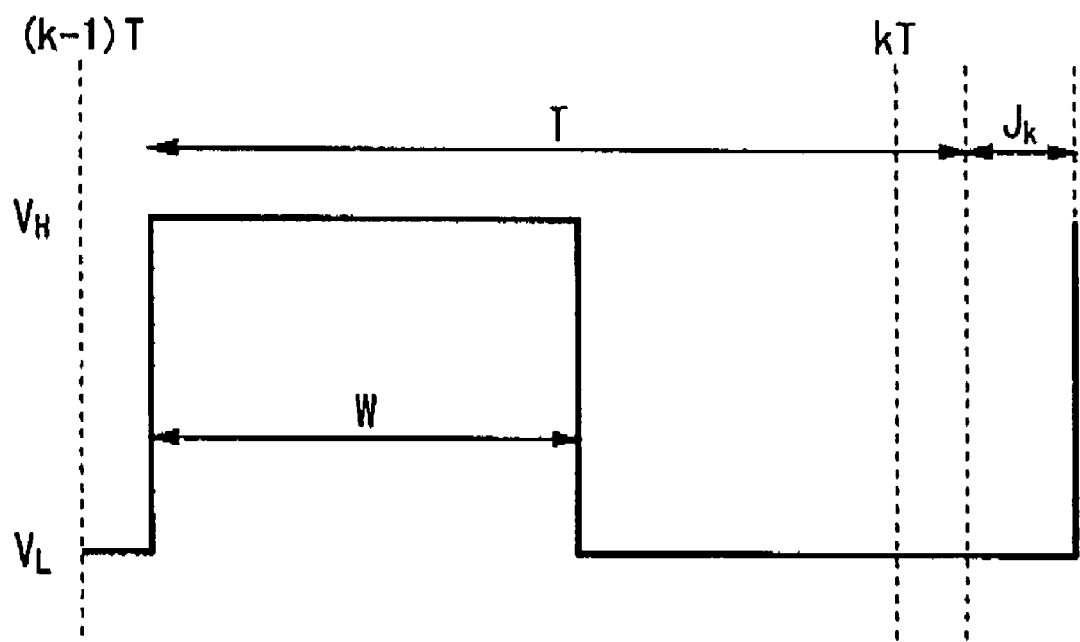
FIG. 4 shows, as one example, the waveform of the k-th cycle of the demodulated signal.

FIG. 4 shows one example of the waveform of the k-th cycle of the demodulated signal. In FIG. 4, VH denotes the voltage value observed when the demodulated signal indicates a logical value "1", VL denotes the voltage value observed when the demodulated signal indicates a logical value "0", T denotes an average cycle time of the demodulated signal, and Jk denotes the amount of period jitter of the k-th cycle.

Here, the average voltage of the k-th cycle of the demodulated signal is represented by the following expression.

$$\overline{Vk} = \frac{VH \cdot W + VL(T + Jk - W)}{T + Jk} = VL + \frac{(VH - VL)W}{T} \cdot \frac{1}{1 + \frac{Jk}{T}} \quad \text{Expression (1)}$$

Here, if Jk/T is represented as Jk', the expression (1) is replaced with the following expression.

$$\overline{Vk} = VL + \frac{(VH - VL)W}{T} \cdot \frac{1}{1 + Jk'} \quad \text{Expression (2)}$$

When the absolute value of Jk' is 0.1 or smaller, the following approximation can be established within an error of no more than 1%.

$$\frac{1}{1 + Jk'} \approx 1 - Jk' \quad \text{Expression (3)}$$

By substituting the expression (3) into the expression (2), the following expression is obtained.

$$\overline{Vk} \approx -\frac{(VH - VL)W}{T}Jk' + \left[VL + \frac{(VH - VL)W}{T}\right] \quad \text{Expression (4)}$$

As indicated by the expression (4), the average voltage is proportional to the period jitter Jk'. Therefore, if the demodulated signal is measured, the period jitter can be measured. The measuring section 110 may measure the period jitter by measuring the average voltage of the demodulated signal.

Note that the amount of timing jitter is equal to the amount obtained by accumulating the period jitter. Therefore, the timing jitter can be obtained by integrating the period jitter. The measuring section 110 may measure the timing jitter of the demodulated signal based on a signal generated by integrating the demodulated signal. In this case, it is preferable that the gain of the integrating circuit is notified in advance to the measuring section 110. This is because the influence of the variation of the characteristics of the integrating circuit can be eliminated by dividing the timing jitter by the gain of the integrating circuit.

Based on the expression (4), the gain G of the demodulator 230 is represented, as the proportionality constant between the average voltage and period jitter, by the following expression.

$$G = -\frac{(VH - VL)W}{T} \quad \text{Expression (5)}$$

Here, since the pulse width W varies in accordance with factors such as process variation and temperature, the value of the gain G varies among different electronic devices 200. The calibration device 300 calibrates this variance.

The second term in the right-hand side of the expression (4) takes on a constant value since the pulse width W is constant. Meanwhile, the first term of the right-hand side of the expression (4) is proportional to the period jitter Jk', and takes on a value of 0 when time-averaged. Accordingly, the second term of the right-hand side of the expression (4) denotes the DC component of the demodulated signal (VDC), and the following expression can be obtained from the expression (4).

$$VDC = VL + \frac{(VH - VL)W}{T} = VL - G \qquad \text{Expression (6)}$$

Based on the expression (6), the gain G of the demodulator 230 is represented by the following expression.

$$G = VL - VDC \qquad \text{Expression (7)}$$

This expression shows that the gain G of the demodulator 230 can be obtained by the voltage value which is observed when the demodulated signal indicates a logical value "0" (VL) and the voltage value of the DC component of the demodulated signal (VDC). When VL=0 (GND), the gain G of the demodulator 230 can be obtained by the voltage value of the DC component of the demodulated signal (VDC). The DC component detecting section 310 may measure the voltage values VL and VDC. When the voltage value VL is known, the DC component detecting section 310 may measure the voltage value VDC.

The gain calculating section 320 calculates the gain G by using the expression (7) and the result of the measurement performed by the DC component detecting section 310. The calibration section 330 determines a correction coefficient based on the gain G and notifies the correction coefficient to the judging section 120.

The period jitter component (modulation component) indicated by the demodulated signal is obtained by amplification in proportion to the gain G of the demodulator 230. Therefore, the period jitter of the output signal input into the demodulator 230 can be measured by dividing the value of the period jitter measured by the measuring section 110 by the gain G. As a result of this, the jitter can be measured with it being possible to eliminate the influence of process variation or the like on the demodulator 230.

Here, the variance in gain due to process variation is independent of the frequency of the signal, and the influence of process variation can be eliminated by calibration performed based on the DC component. The calibration section 330 can apply the correction value which is calculated based on the DC component to the entire frequency range.

The calibration can be performed at any timing before the test apparatus 100 starts the test or during a time period between when the test apparatus 100 starts the test and when the test apparatus 100 makes the judgment whether the electronic device 200 is pass or fail. While the measuring section 110 measures the jitter amount, the calibration device 300 may concurrently calculates the gain.

Figure 5:
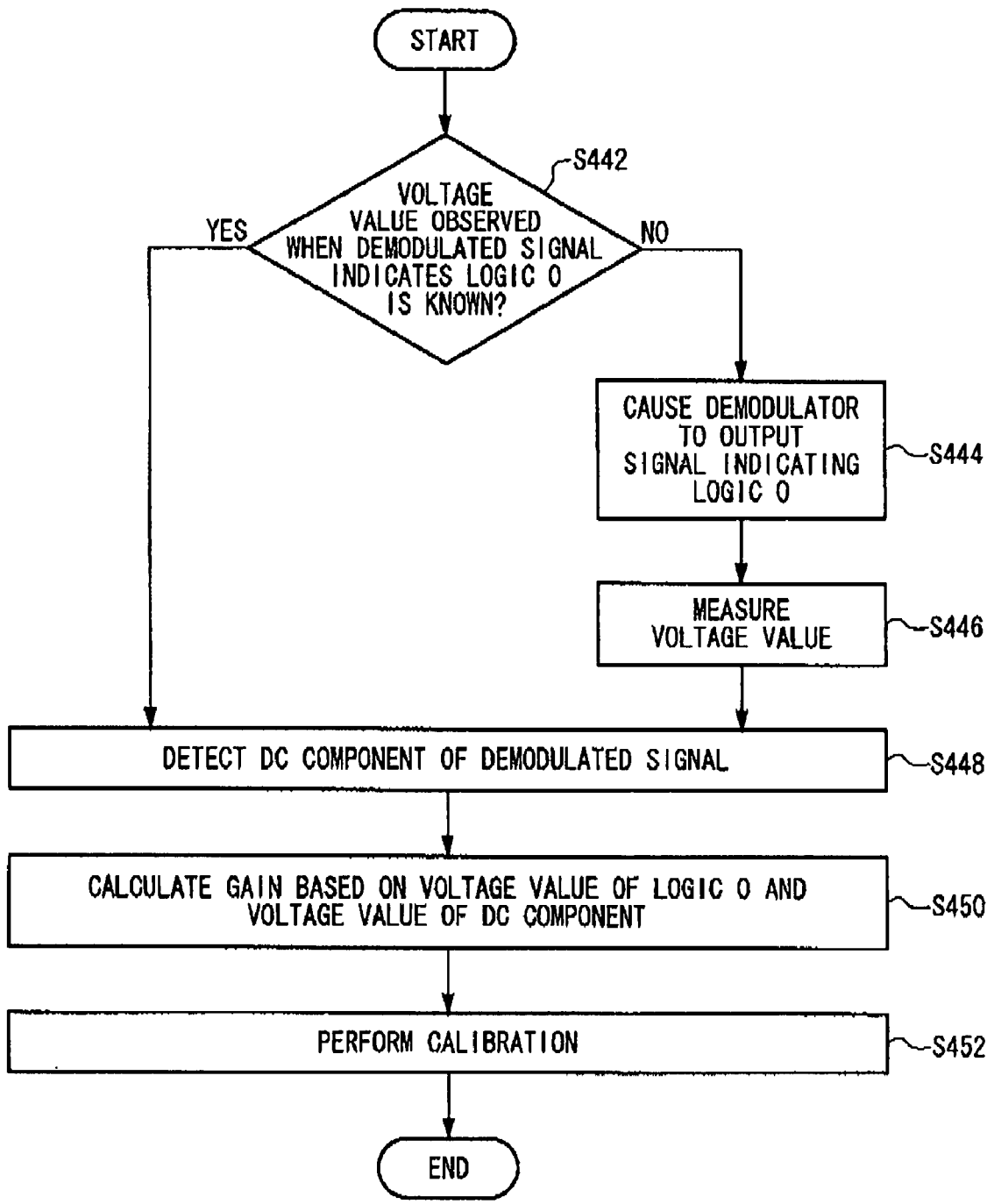
FIG. 5 is a flow chart showing one example of the process performed in a calibration step S440.

FIG. 5 is a flow chart showing one example of the process in the calibration step S440. To begin with, the control section 340 judges whether the voltage value of the demodulated signal observed when the demodulated signal indicates a logical value "0" (VL) is known (S442). If VL is known, the process in the step S448 is performed. If VL is not known, the control section 340 causes the demodulator 230 to output the signal indicating the logical value "0" (S444). In other words, the control section 340 causes the demodulator 230 to output a signal the voltage value of which is fixed to VL.

Here, the DC component detecting section 310 measures the voltage value VL of the signal output from the demodulator 230 (S446).

Subsequently, the control section 340 causes the demodulator 230 to output the demodulated signal. The DC component detecting section 310 detects the DC component of the demodulated signal (S448). The DC component detecting section 310 may detect, as the DC component, the average voltage of the demodulated signal.

Following this, the gain calculating section 320 calculates the gain G of the demodulator 230 based on the voltage value of the demodulated signal when the demodulated signal indicates the logical value "0" (VL) and the voltage value of the DC component (VDC) (S450). The calibration section 330 then performs calibration based on the calculated gain (S452).

Figure 6:
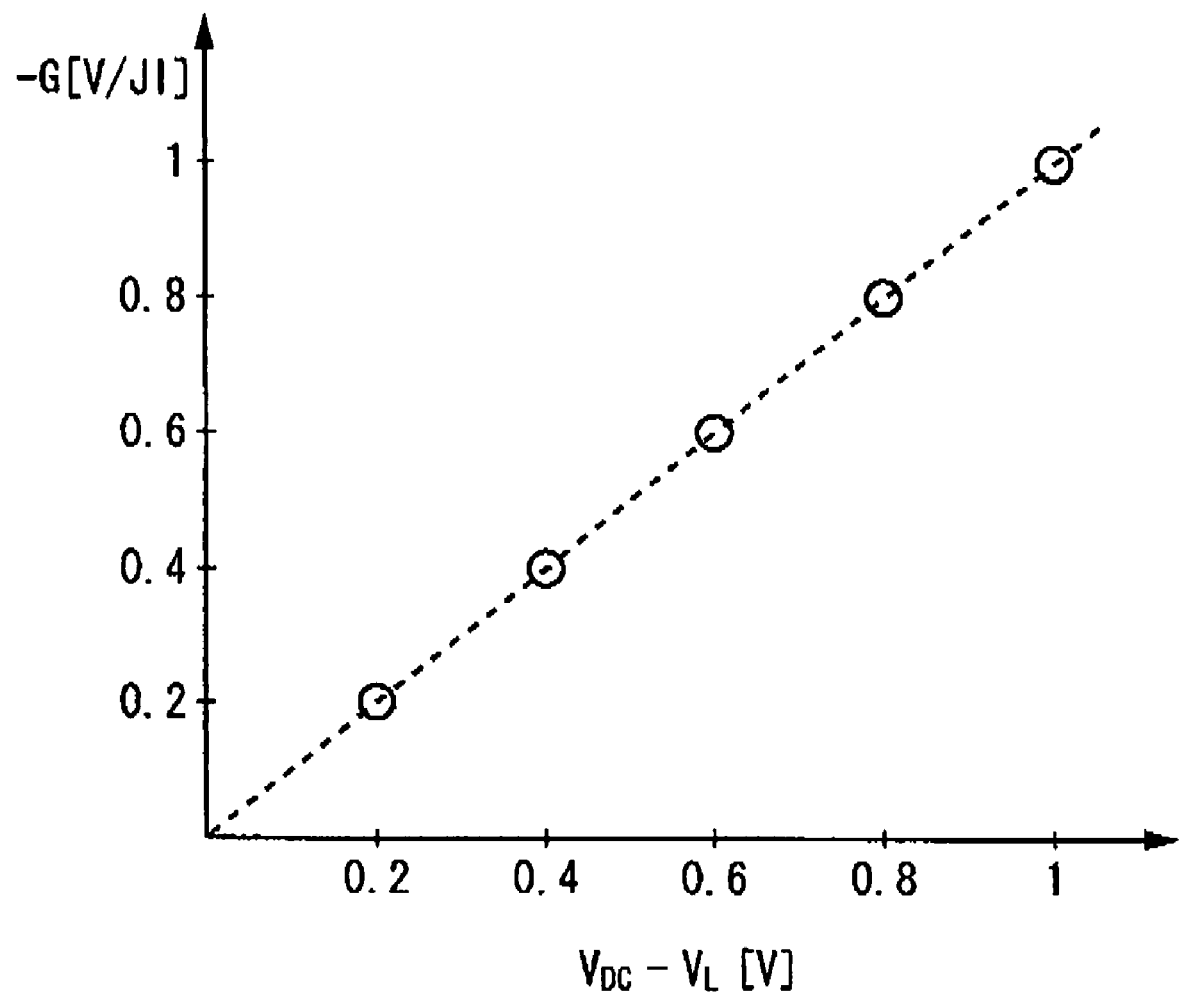
FIG. 6 shows the gain −G of the demodulator 230 which is simulated (MATLAB) by varying the difference between VDC and VL, with the use of the demodulated signal which is output from the demodulator 230 when a clock into which a sinusoidal period jitter is injected is input into the demodulator 230 as the output signal.

FIG. 6 shows the gain −G of the demodulator 230 which is simulated (MATLAB) by varying the difference between VDC and VL, with the use of the demodulated signal which is output from the demodulator 230 when a clock into which a sinusoidal period jitter is injected is input into the demodulator 230 as the output signal. In FIG. 6, the gain is calculated by setting the difference between VDC and VL at 0.2 V, 0.4 V, 0.6 V, 0.8 V, and 1 V, and the calculated gains are plotted. As shown in FIG. 6, the gains are plotted on the linear line going through the origin and the coordinates (1, 1), which proves that the expression (7) is true.

Figure 7:
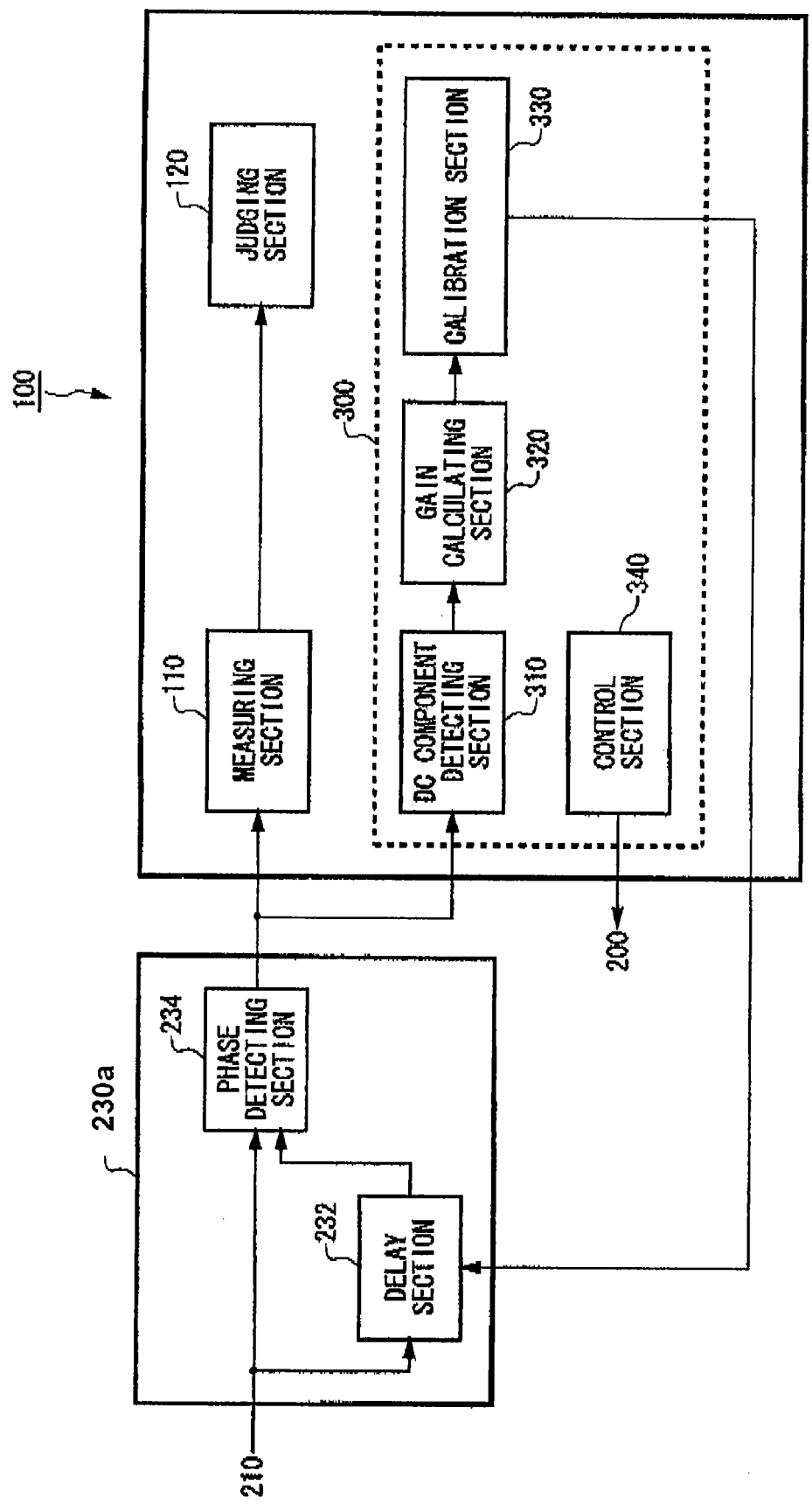
FIG. 7 shows one example of the configuration of the demodulator 230.

FIG. 7 shows one example, 230a, of the configuration of the demodulator 230, shown in FIG. 1. According to the present embodiment, the demodulator 230a includes therein a delay section 232 and a phase detecting section 234. The delay section 232 receives the output signal output from the operational circuit 210, and delays the output signal by a predetermined delay time to generate a delayed signal. Here, the delay time of the delay section 232 is substantially the same as the above-mentioned pulse width W.

The phase detecting section 234 receives the output signal output from the operational circuit 210 and the delayed signal output from the delay section 232, and outputs a pulse having a pulse width corresponding to the difference in phase between the output signal and delayed signal, thereby generating the demodulated signal. The phase detecting section 234 may be an XOR circuit, for example. It should be noted that the difference in phase is substantially the same as the delay time of the delay section 232. Therefore, the pulse width of the demodulated signal is substantially the same as the delay time.

It is preferable that the delay time of the delay section 232 is controllable by an external device. In this case, the calibration device 300 may control the delay time of the delay section 232 in order to adjust the gain of the demodulator 230a. As can be seen from the expression (5), the gain of the demodulator 230a can be adjusted by adjusting the delay time of the delay section 232, that is to say, the pulse width W of the demodulated signal. Here, the calibration device 300 may adjust the delay time of the delay section 232 in such a manner that the gain of the demodulator 230a takes on the most optimal value (maximum value). Here, it is preferable that the measuring section 110 measures the demodulated signal after the calibration device 300 adjusts the delay time.

The configuration of the demodulator 230 is not limited to the configuration shown in FIG. 7. For example, the demodulator 230 may additionally include therein a frequency divider which divides the frequency of the output signal, and inputs the frequency-divided output signal into the delay section 232 and phase detecting section 234. Moreover, the demodulator 230 may further include therein an inverter which judges the output from the delay section 232. In this case, the phase detecting section 234 may be an AND circuit. Alternatively, the phase detecting section 234 may be a phase frequency detector.

Figure 8:
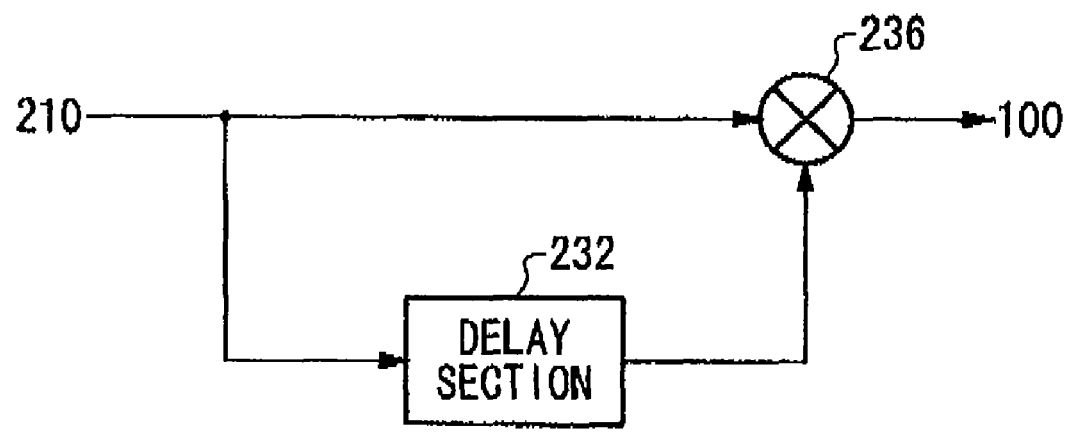
FIG. 8 shows another example of the configuration of the demodulator 230.

FIG. 8 shows another example of the configuration, 230b, of the demodulator 230. According to the present embodiment, the demodulator 230b includes therein the delay section 232 and a mixer 236. The delay section 232 receives the output signal output from the operational circuit 210, and delays the output signal by a predetermined delay time, thereby generating a delayed signal. For example, the delay section 232 delays the output signal by a quarter of the cycle time to generate the delayed signal. The mixer 236 multiplies the output signal by the delayed signal, to generate the demodulated signal.

The phase-modulated output signal f(t) is represented by the following expression, for example.

$$f(t) = \sin(\omega_0 t + \Delta\phi(t)) \quad \text{Expression (8)}$$

Here, $\omega_0$ denotes the angular frequency of the carrier component of the output signal, and $\Delta\phi(t)$ denotes the phase-modulation component.

In this case, the delayed signal g(t) which is generated by delaying the output signal by a quarter of the cycle time is represented by the following expression.

$$g(t) = \sin\left(\omega_0\left(t - \frac{T}{4}\right) + \Delta\phi\left(t - \frac{T}{4}\right)\right) - \cos\left(\omega_0 t + \Delta\phi\left(t - \frac{T}{4}\right)\right) \quad \text{Expression (9)}$$

Here, T denotes the cycle time of the carrier component of the output signal.

The demodulated signal v(t) output from the mixer 236 is generated by multiplying the signal represented by the expression (8) by the signal represented by the expression (9), and therefore represented by the following expression.

$$v(t) = \frac{1}{2}\left\{\sin\left(2\omega_0 t + \Delta\phi(t) + \Delta\phi\left(t - \frac{T}{4}\right)\right) - \sin\left(\Delta\phi(t) - \Delta\phi\left(t - \frac{T}{4}\right)\right)\right\} \quad \text{Expression (10)}$$

Here, the first term of the right-hand side of the expression (10) is removed by using a low-pass filter. As a result, the demodulated signal v(t) is represented by the following expression.

$$v(t) = -\frac{1}{2}\sin\left(\Delta\phi(t) - \Delta\phi\left(t - \frac{T}{4}\right)\right) \quad \text{Expression (11)}$$

If $\Delta\phi(t) - \Delta\phi(t-T/4)$ is sufficiently small, the following approximation can be established from the expression (11).

$$v(t) \approx -\frac{1}{2}\left(\Delta\phi(t) - \Delta\phi\left(t - \frac{T}{4}\right)\right) \quad \text{Expression (12)}$$

As indicated by the expression (12), the amount of variation in timing jitter (i.e. period jitter) can be obtained for each quarter of the cycle time based on the output from the mixer 236. Therefore, the timing jitter of the output signal can be extracted by accumulating the obtained amount of variation in timing jitter for each quarter of the cycle time. The demodulator 230 may additionally include therein a low-pass filter to remove the first term of the right-hand side of the question (10).

The calibration section 330 may calculate the correction value based on the gain of the demodulator 230.

Figure 9:
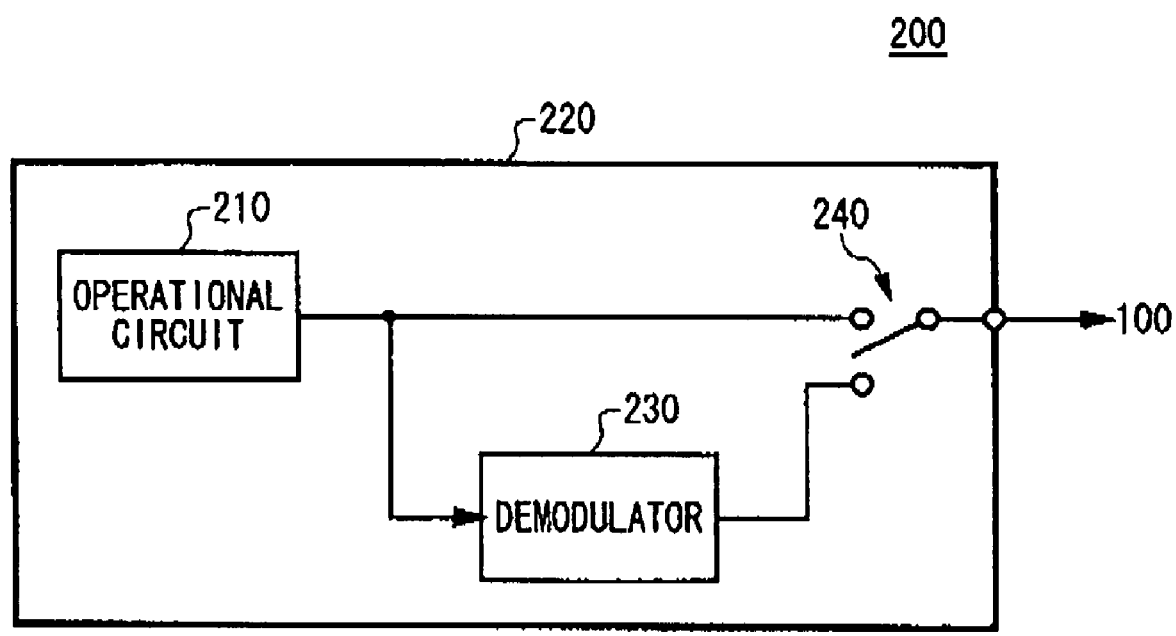
FIG. 9 shows another example of the configuration of the electronic device 200.

FIG. 9 shows another example of the configuration of the electronic device 200. According to the present embodiment, the electronic device 200 includes therein an output section 240 in addition to the constituents of the electronic device 200 shown in FIG. 1. The constituents other than the output section 240 may have the same functions as the corresponding constituents assigned with the same reference numerals in FIG. 1.

The output section 240 receives the output signal output from the operational circuit 210 and the demodulated signal output from the demodulator 230, selects one of the signals and outputs the selected signal to an external device. For example, the output section 240 outputs the output signal to an external device when the electronic device 200 actually operates, and outputs the demodulated signal to an external device when the electronic device 200 is tested. Alternatively, the output section 240 may normally output the output signal to an external device, and output the demodulated signal to an external device when instructed by an external device to output the demodulated signal.

Figure 10:
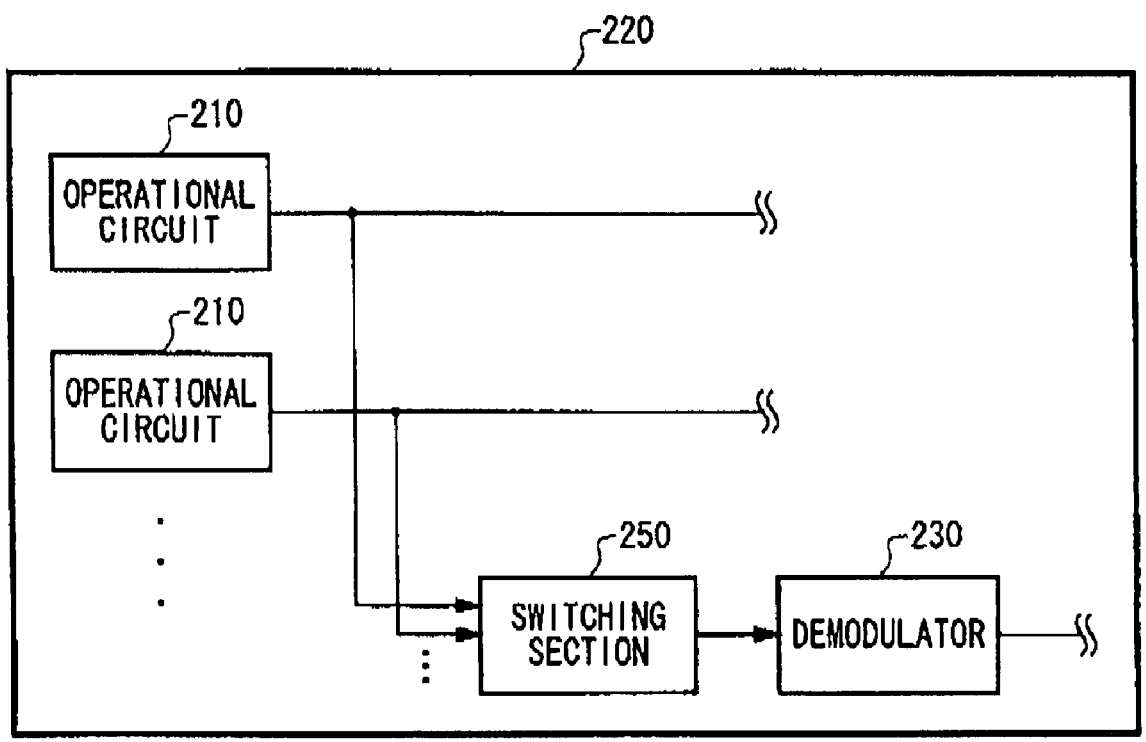
FIG. 10 shows another example of the configuration of the electronic device 200.

FIG. 10 shows another example of the configuration of the electronic device 200. According to the present embodiment, the electronic device 200 includes therein a plurality of operational circuits 210, a switching section 250, and the demodulator 230. The plurality of operational circuits 210 respectively generate output signals. The switching section 250 switches the input into the demodulator 230 between the output signals output from the plurality of operational circuits 210. For example, the switching section 250 may receive from the test apparatus 100 an instruction indicating which of the operational circuits 210 is to be tested, and select a corresponding one of the output signals in accordance with the instruction.

The demodulator 230 demodulates the output signal input thereto, and outputs the demodulated signal. The demodulator 230 may output the demodulated signal to an external device via the output section 240 as shown in FIG. 9, or without involving the output section 240.

Figure 11:
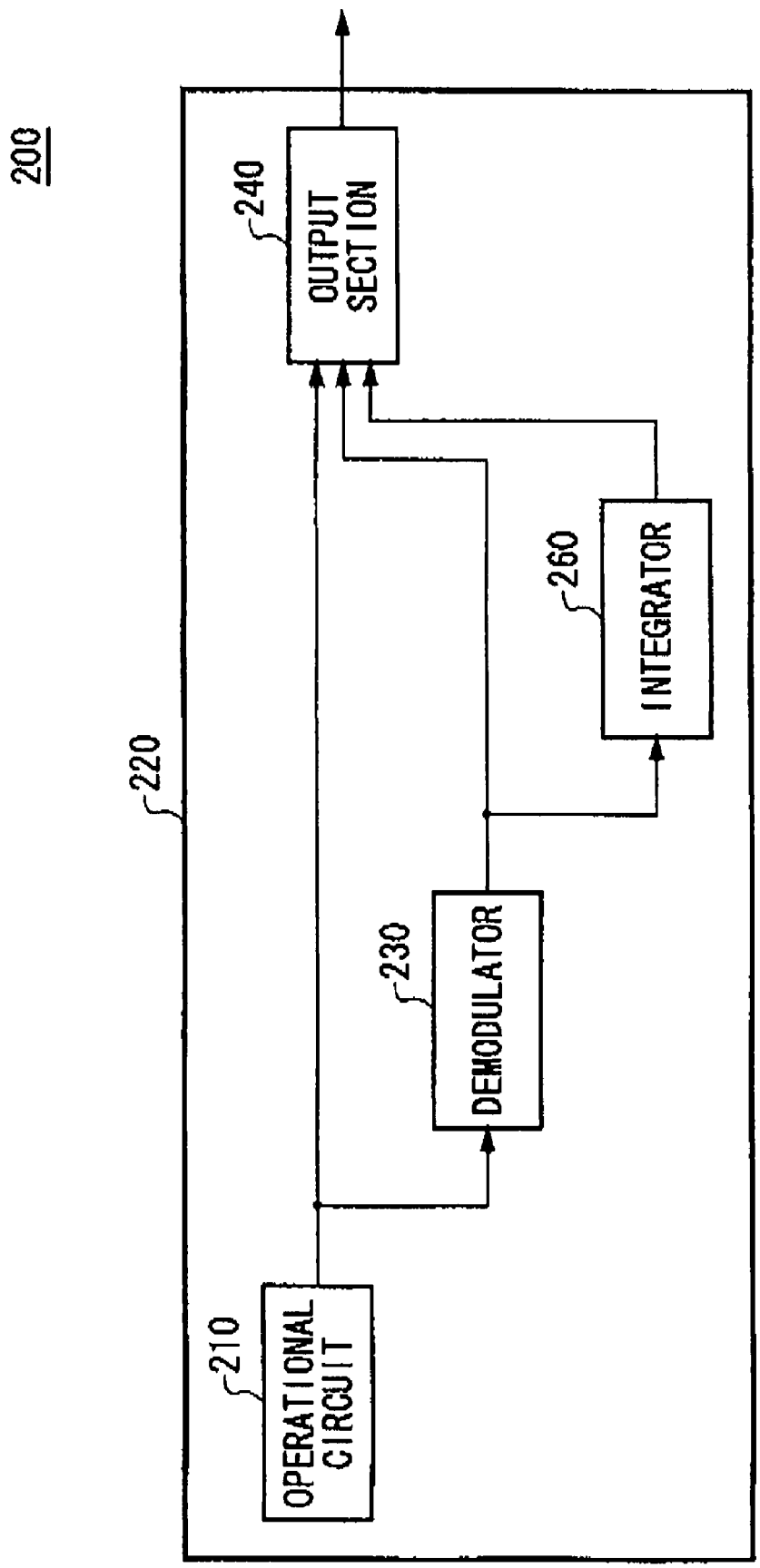
FIG. 11 shows another example of the configuration of the electronic device 200.

FIG. 11 shows another example of the configuration of the electronic device 200. According to the present embodiment, the electronic device 200 includes therein an integrator 260 in addition to the constituents of the electronic device 200 shown in FIG. 9. The constituents other than the integrator 260 may have the same functions as the corresponding constituents assigned with the same reference numerals in FIG. 9.

The integrator 260 integrates the demodulated signal output from the demodulator 230. For example, the integrator 260 may be a capacitor which is charged with a predetermined charge current while the demodulated signal indicates a logical value "1" and is discharged with a predetermined discharge current while the demodulated signal indicates a logical value "0". The voltage value of the capacitor indicates the integrated value of the demodulated signal.

The output section 240 selects one of the output signal output from the operational circuit 210, the demodulated signal output from the demodulator 230, and the signal output from the integrator 260, and outputs the selected signal to an external device. For example, the output section 240 may select the output signal output from the operational circuit 210 when the electronic device 200 actually operates, the demodulated signal when the period jitter of the output signal is to be measured, and the output signal from the integrator 260 when the timing jitter of the output signal is to be measured.

It is preferable that the gain of the integrator 260 is notified in advance to the calibration section 330. Since the modulation component of the signal output from the integrator 260 has been amplified by the gains of the demodulator 230 and integrator 260, the calibration section 330 preferably performs the calibration based not only on the measured gain of the demodulator 230 but also on the gain of the integrator 260.

Figure 12:
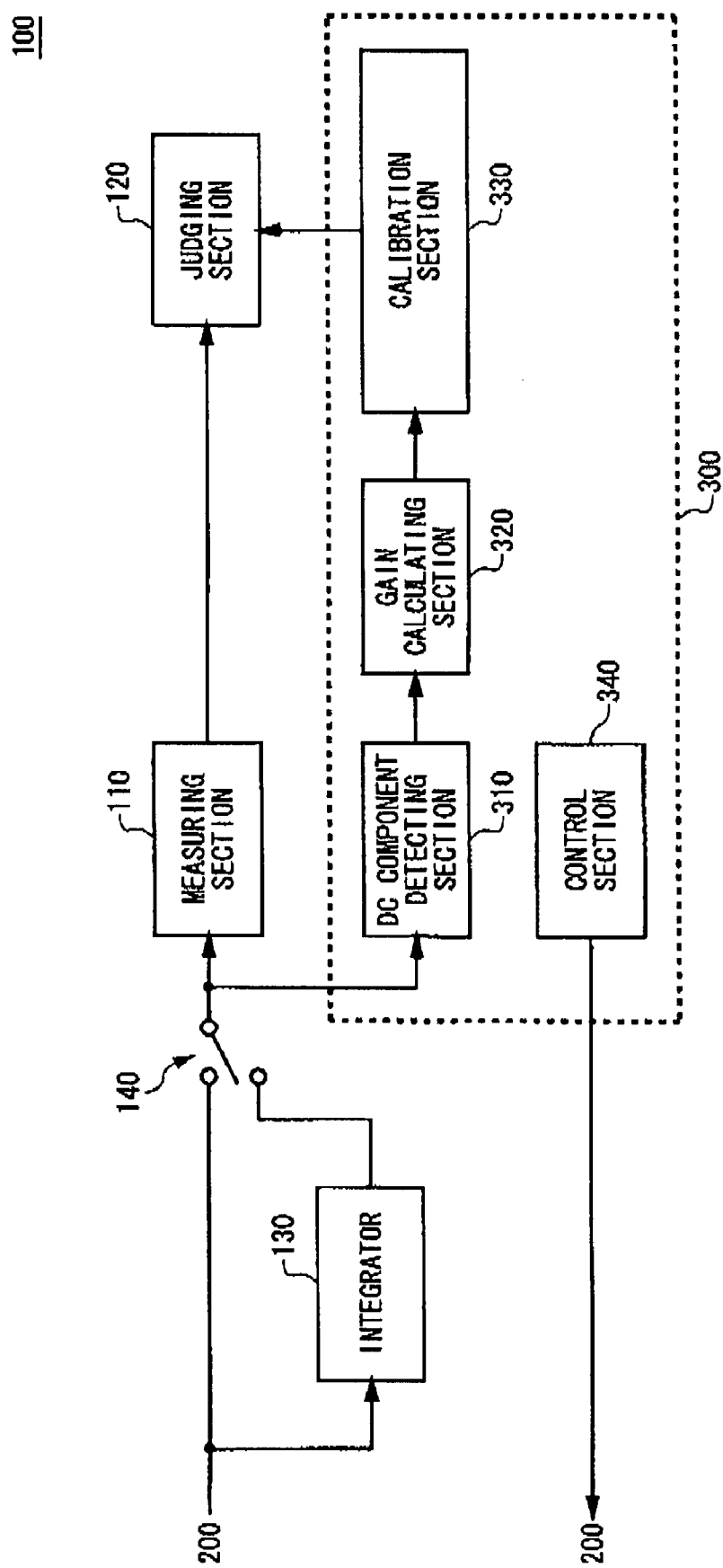
FIG. 12 shows another example of the configuration of the test apparatus 100.

FIG. 12 shows another example of the configuration of the test apparatus 100. According to the present embodiment, the test apparatus 100 includes therein an integrator 130 and a switching section 140 in addition to the constituents of the test apparatus 100 shown in FIG. 1. In the present embodiment, the electronic device 200 may not be required to include therein the integrator 260 illustrated with reference to FIG. 11.

The integrator 130 integrates the demodulated signal output from the electronic device 200. The switching section 140 selects one of the demodulated signal and the output signal from the integrator 130, and inputs the selected signal into the measuring section 110 and the DC component detecting section 310. For example, the switching section 140 may select the demodulated signal when the period jitter of the output signal is to be measured, and select the output signal from the integrator 130 when the timing jitter of the output signal is to be measured. The switching section 140 may select the demodulated signal when the gain of the demodulator 230 is to be measured.

It is preferable that the gain of the integrator 130 is notified in advance to the calibration section 330.

Figure 13:
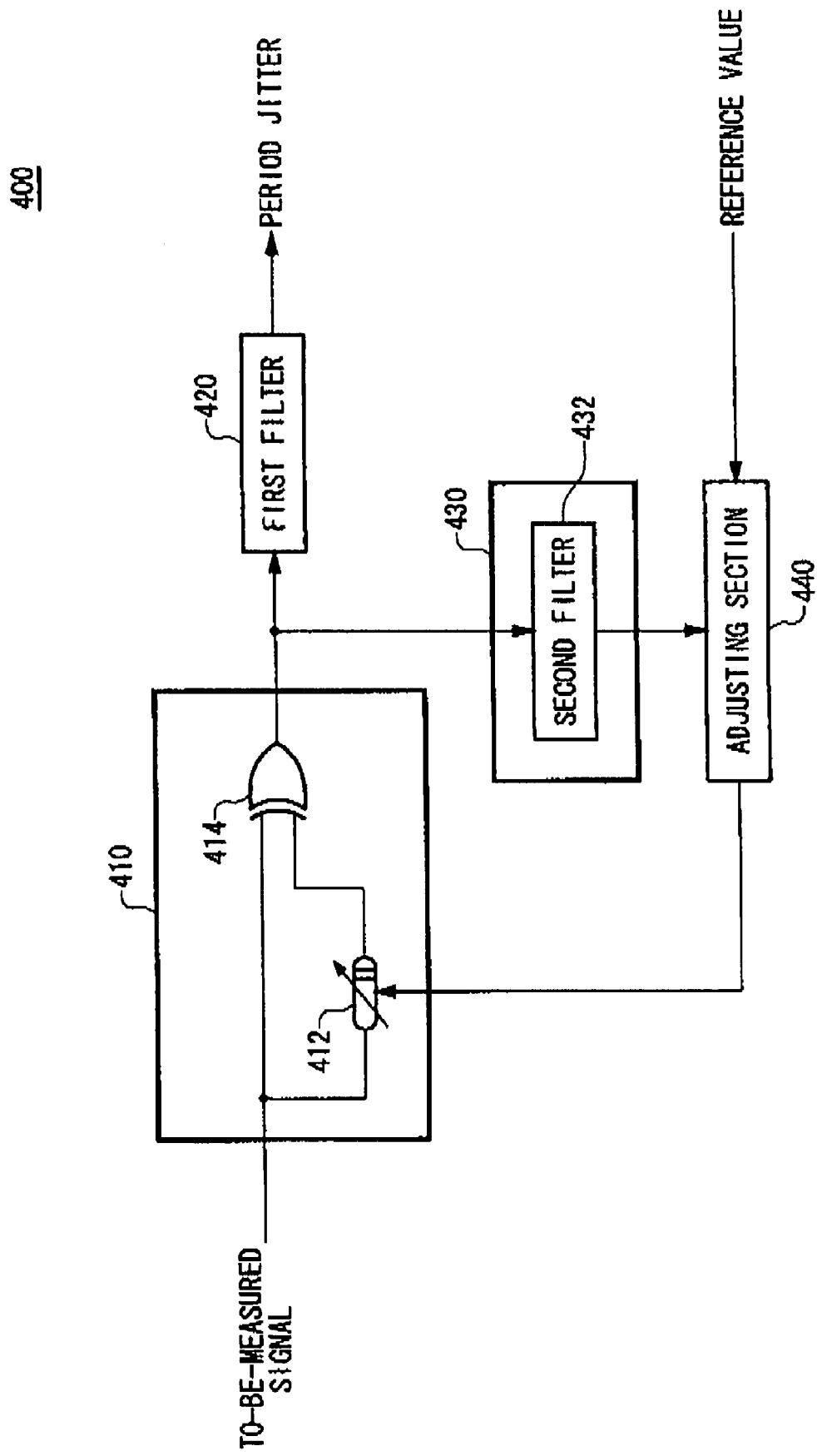
FIG. 13 shows one example of the configuration of a jitter measurement apparatus 400 relating to one embodiment of the present invention.

FIG. 13 shows one example of the configuration of a jitter measurement apparatus 400 relating to an embodiment of the present invention. The jitter measurement apparatus 400 is used to measure the jitter of a signal under measurement. The jitter measurement apparatus 400 includes therein a pulse generator 410, a first filter 420, a DC component detecting section 430, and an adjusting section 440.

The pulse generator 410 outputs a demodulated signal indicating the jitter of the signal under measurement by outputting a pulse having a substantially constant pulse width at each predetermined edge of the signal under measurement. For example, the pulse generator 410 outputs a pulse having a substantially constant pulse width at each rising edge of the signal under measurement. The pulse generator 410 may have the same function and configuration as the demodulator 230 illustrated with reference to FIG. 3. According to the present embodiment, the pulse generator 410 includes a variable delay circuit 412 and a logic circuit 414.

The variable delay circuit 412 receives the signal under measurement, which is split and input thereto, delays the signal under measurement by a settable delay time, and outputs the delayed signal. The logic circuit 414 outputs the demodulated signal by outputting a pulse based on the signal under measurement and the delayed signal. For example, the logic circuit 414 may output a logical XOR between the signal under measurement and delayed signal. In this case, the pulse generator 410 outputs a pulse having a pulse width substantially the same as the delay time of the variable delay circuit 412 in synchronization with both the rising and falling edges of the signal under measurement.

Alternatively, the logic circuit 414 may output a logical AND between the signal under measurement and the inverted delayed signal. In this case, the pulse generator 410 outputs a pulse having a pulse width which is substantially the same as the delay time of the variable delay circuit 412 in synchronization with the rising edge of the signal under measurement as shown in FIG. 3. Configured in the above-described manner, the pulse generator 410 can output the demodulated signal indicating the period jitter of the signal under measurement. For example, the period jitter of the signal under measurement corresponds to the variation in average voltage of the demodulated signal in terms of each cycle of the signal under measurement.

The first filter 420 averages the waveform of the demodulated signal output from the pulse generator 410, and outputs the averaged waveform. For example, the first filter 420 may be a low-pass filter which removes, from the demodulated signal, a higher frequency component than a predetermined cut off frequency. Operating in this manner, the first filter 420 can average the waveform of the demodulated signal, and output the averaged waveform as a signal indicating the period jitter. For example, the cut off frequency of the first filter 420 may be set at a frequency which makes it possible to detect the variation in average voltage of the demodulated signal in terms of each cycle of the signal under measurement.

The DC component detecting section 430 receives the demodulated signal which is output from the pulse generator 410 and split, and detects the DC component of the demodulated signal. For example, the DC component detecting section 430 may remove, from the demodulated signal, a higher frequency component than a predetermined cut off frequency. According to the present embodiment, the DC component detecting section 430 includes therein a second filter 432.

The second filter 432 receives the demodulated signal and passes the DC component of the demodulated signal. For example, the second filter 432 may be a low-pass filter which removes, from the demodulated signal, a higher frequency component than a predetermined cut off frequency. It should be noted here that the cut off frequency of the second filter 432 is lower than the cut off frequency of the first filter 420. For example, when jitter having a frequency lower than the carrier frequency of the signal under measurement is injected into the signal under measurement, the cut off frequency of the first filter 420 may be lower than the carrier frequency of the signal under measurement, but higher than the maximum frequency of the jitter component. Here, the cut off frequency of the second filter 432 may be lower than the maximum frequency of the jitter component. It is preferable that the cut off frequency of the second filter 432 is sufficiently lower than the response frequency of the feedback loop.

The adjusting section 440 adjusts the pulse width of the pulse output from the pulse generator 410, based on the DC component of the demodulated signal which is detected by the DC component detecting section 430. For example, the adjusting section 440 adjusts the pulse width of the pulse output from the pulse generator 410 so that the DC component of the demodulated signal substantially coincides with a predetermined reference value. For example, the adjusting section 440 may adjust the pulse width by controlling the delay time of the variable delay circuit 412 based on negative feedback with reference to the difference between the level of the DC component of the demodulated signal and reference value.

As described with reference to FIG. 4, the DC component of the demodulated signal is determined by the gain of the pulse generator 410. Therefore, the jitter gain of the pulse generator 410 can be prevented from varying by dynamically controlling the pulse generator 410, while the jitter measurement apparatus 400 is measuring the signal under measurement, to make sure that the DC component of the demodulated signal is equal to the reference value.

Since the reference value is known, the period jitter of the signal under measurement can be obtained by dividing the variation in average voltage output from the first filter 420 by the reference value. In addition, the jitter gain of the pulse generator 410 may be set to a desired value by setting the reference value in accordance with the desired jitter gain.

Configured in the above-described manner, the jitter measurement apparatus 400 can accurately measure the jitter of the signal under measurement. Here, the reference value may be set in advance by a user in accordance with a desired jitter gain.

Figure 14:
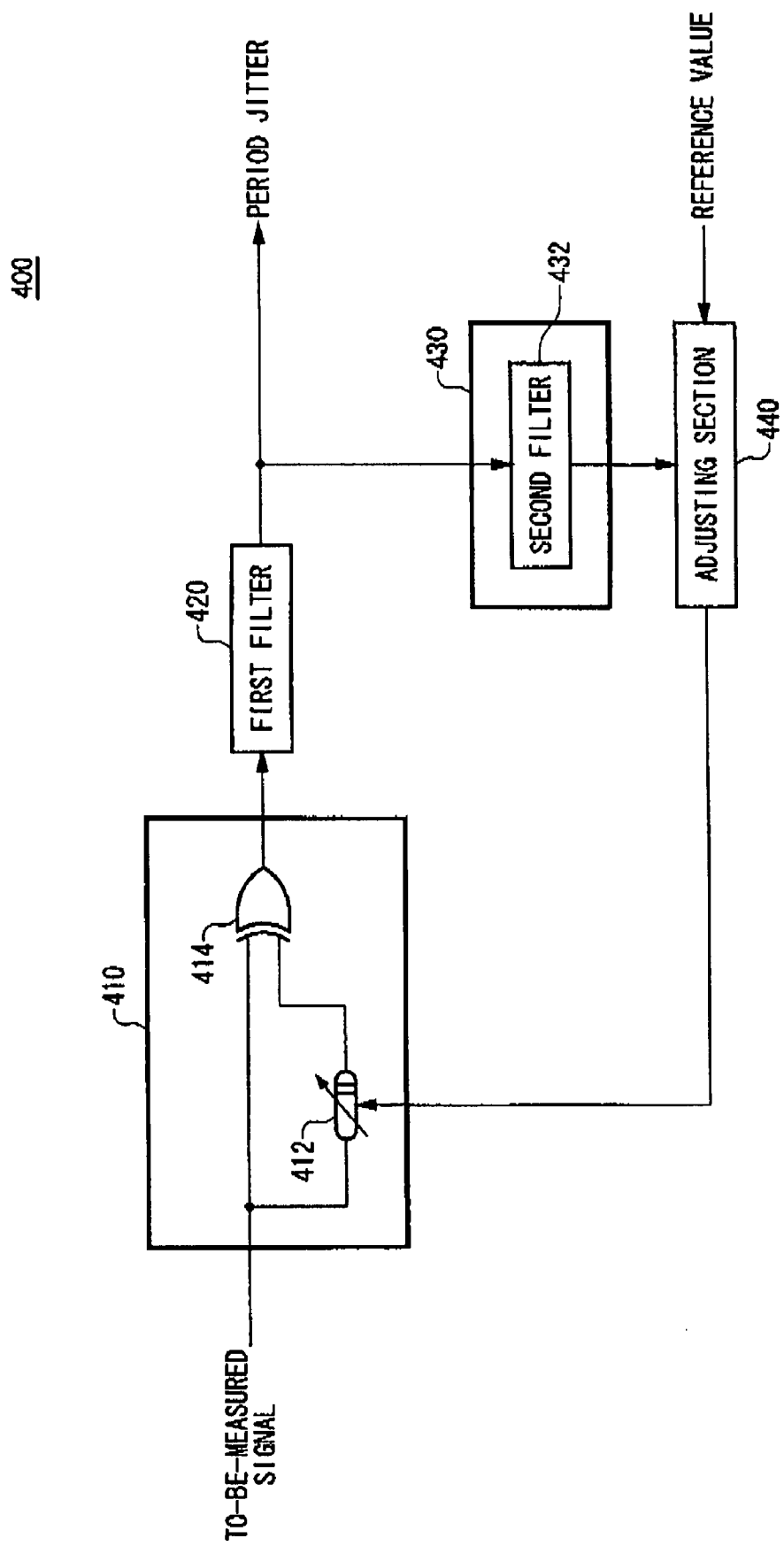
FIG. 14 shows another example of the configuration of the jitter measurement apparatus 400.

FIG. 14 shows another example of the configuration of the jitter measurement apparatus 400. The jitter measurement apparatus 400 relating to the present embodiment is different from the jitter measurement apparatus 400 illustrated with reference to FIG. 13 in that the DC component detecting section 430 receives the demodulated signal which is output from the first filter 420 and split. Except for this, the jitter measurement apparatus 400 relating to the present embodiment has the same function and configuration as the jitter measurement apparatus 400 illustrated with reference to FIG. 13. In the present embodiment, the DC component detecting section 430 receives the demodulated signal from which a certain high frequency component has already been removed by the first filter 420. This makes it easier to design the second filter 432.

Figure 15A:
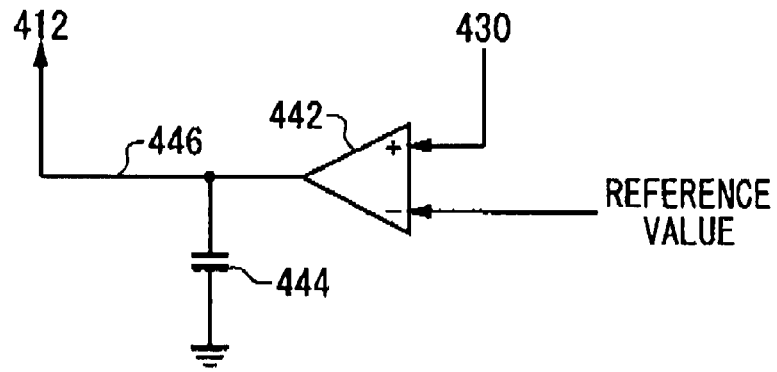
FIG. 15A shows one example of the configuration of an adjusting section 440.
Figure 15B:
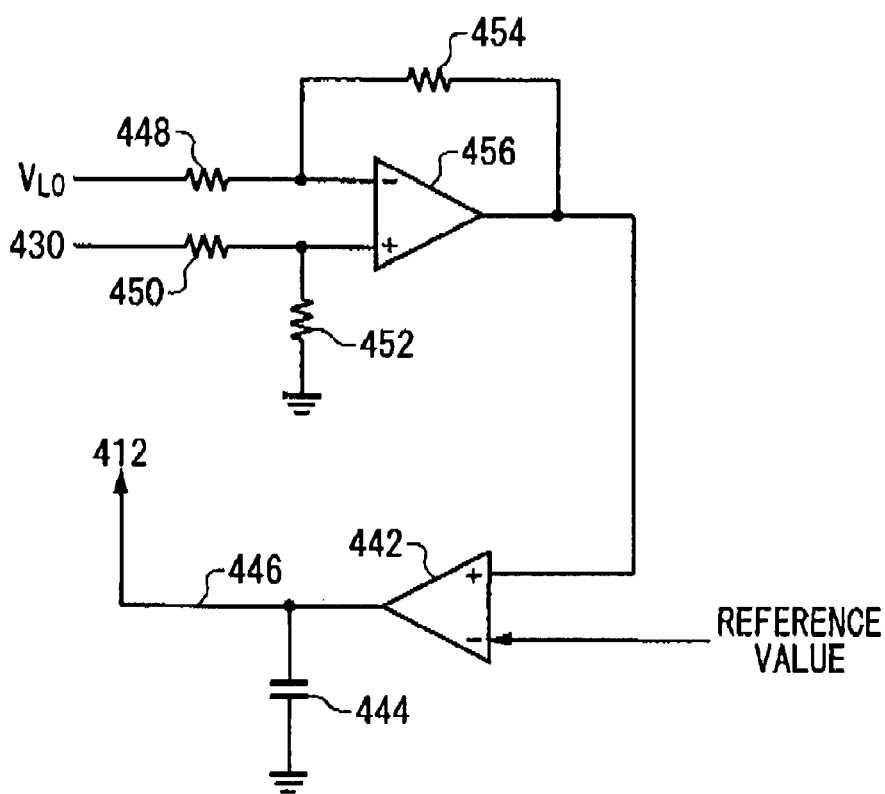
FIG. 15B shows one example of the configuration of the adjusting section 440.

FIGS. 15A and 15B respectively show the examples of the configuration of the adjusting section 440. The adjusting section 440 shown in FIG. 15A includes therein a differential amplifier 442, a transmission path 446 and a capacitor 444. The differential amplifier 442 outputs, to the pulse generator 410, a voltage determined in accordance with the difference between the DC component of the demodulated signal output from the DC component detecting section 430 and the reference value. The differential amplifier 442 may be an amplifier that outputs the difference with the gain being set to substantially "1".

The transmission path 446 electrically connects the output terminal of the differential amplifier 442 to the control terminal of the variable delay circuit 412. The variable delay circuit 412 may generate a delay time in accordance with the voltage input into the control terminal thereof. The capacitor 444 is provided between the transmission path 446 and the ground potential. In this way, the voltage output from the differential amplifier 442 can be maintained and supplied to the variable delay circuit 412. Also, a radical variation in voltage output from the differential amplifier 442 can be reduced.

The adjusting section 440 shown in FIG. 15B includes therein a differential circuit 456 and resistances 448, 450, 452 and 454 in addition to the constituents of the adjusting section 440 shown in FIG. 15A. The differential circuit 456 is provide between the DC component detecting section 430 and differential amplifier 442, and supplies, to the differential amplifier 442, the difference between the level of DC component of the demodulated signal which is output from the DC component detecting section 430 and a predetermined level VLO, as the level of the DC component of the demodulated signal. Note that the predetermined level VLO is a level the demodulated signal output from the pulse generator 410 when the demodulated signal indicates an L logic.

In other words, the differential circuit 456 subtracts the level VLO corresponding to an offset component, from the level of the DC component detecting section 430, and supplies the result of the subtraction to the differential amplifier 442. With this configuration, the reference value or the like which is input into the differential amplifier 442 can be set without considering the offset component of the demodulated signal. The level VLO, which is observed when the demodulated signal indicates an L logic, may be generated by the pulse generator 410, and supplied to the differential circuit 456 by the logic circuit 414. For example, the logic circuit 414 may supply, to the differential circuit 456, the negative power supply voltage or the like which defines the output level of the L logic of the logic circuit 414.

The resistance 448 is provided on the transmission path which supplies the level VLO to the negative input terminal of the differential circuit 456. The resistance 450 is provided between the DC component detecting section 430 and the positive input terminal of the differential circuit 456. The resistance 454 is provided between the output terminal and negative input terminal of the differential circuit 456. The resistance 452 is provided between the positive input terminal of the differential circuit 456 and the ground potential.

The resistances 448 and 450 may have substantially the same resistance value. The resistances 454 and 452 may have substantially the same resistance value. In this case, the differential circuit 456 amplifies the difference between the input voltages by a gain determined in accordance with the ratio between the resistance values of the resistances 448 and 454, and outputs the result of the amplification.

Figure 16:
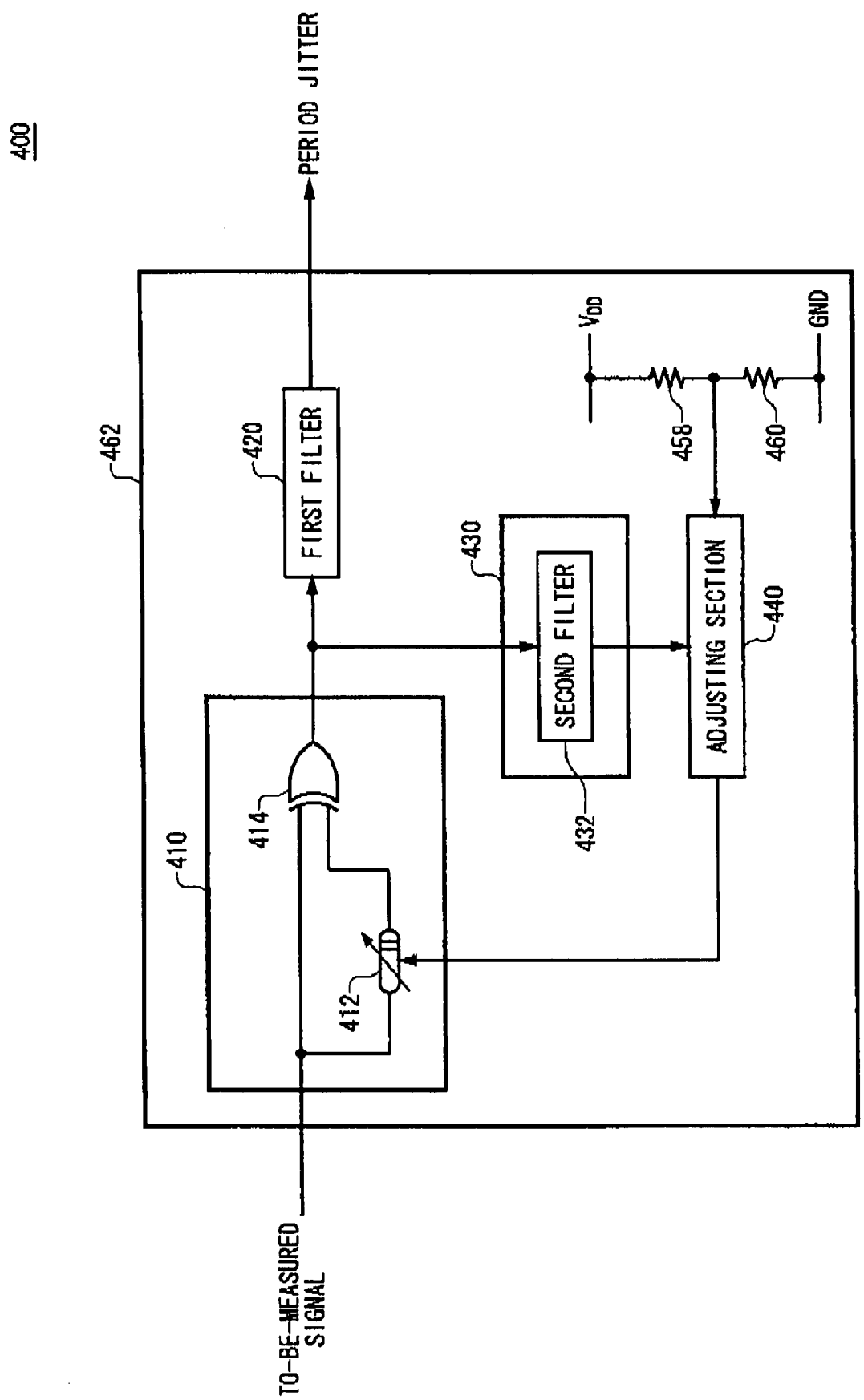
FIG. 16 shows another example of the configuration of the jitter measurement apparatus 400.

FIG. 16 shows another example of the configuration of the jitter measurement apparatus 400. According to the present embodiment, the jitter measurement apparatus 400 may include therein two series resistances 458 and 460 in addition to the constituents of the jitter measurement apparatus 400 illustrated with reference to one of FIGS. 13 and 14. The jitter measurement apparatus 400 shown in FIG. 16 includes the two series resistances 458 and 460 in addition to the constituents of the jitter measurement apparatus 400 shown in FIG. 13. Here, the jitter measurement apparatus 400 is provided on a semiconductor chip 462.

The two series resistances 458 and 460 are disposed in series, within the semiconductor chip 462, between positive and negative power supply wires. The positive and negative power supply wires may be wires to supply source power to constituents including the pulse generator 410, first filter 420, DC component detecting section 430, and adjusting section 440.

The two series resistances 458 and 460 divide the positive power supply voltage (VDD in the present embodiment) and negative power supply voltage (GND in the present embodiment) by a predetermined resistance ratio, to generate the reference value. The two series resistance 458 and 460 supply the generated reference value to the adjusting section 440. The two series resistance 458 and 460 may be variable resistances, the resistance values of which are settable by a control voltage supplied by an external device. The resistance values of the two series resistance 458 and 460 are respectively set in advance so as to achieve a resistance ratio corresponding to the jitter gain to be possessed by the jitter measurement apparatus 400. Since the jitter measurement apparatus 400 is configured in the above-described manner, the jitter gain of the jitter measurement apparatus 400 can be maintained at a substantially constant level in spite of a temperature variation or the like.

Figure 17:
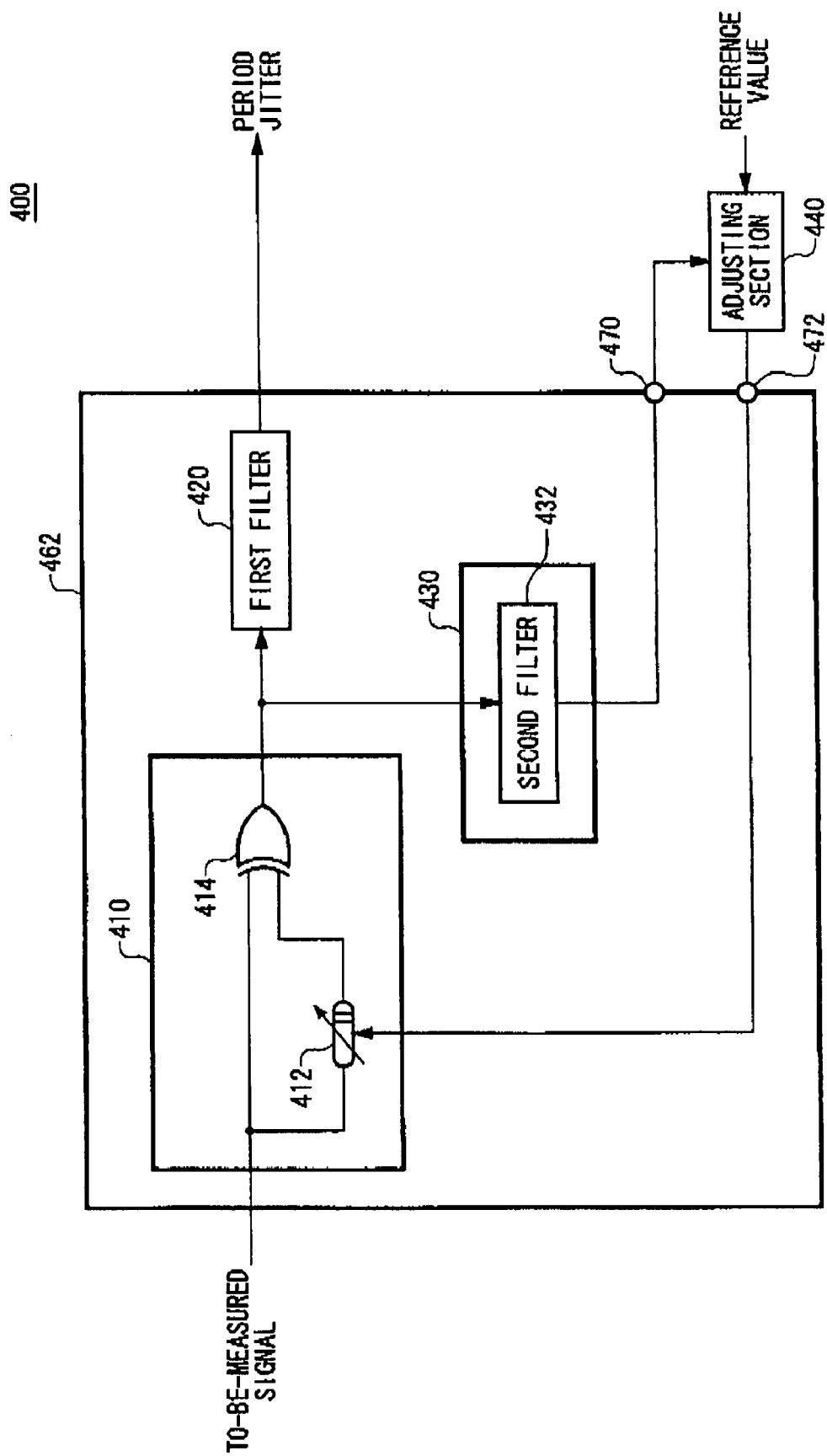
FIG. 17 shows another example of the configuration of the jitter measurement apparatus 400.

FIG. 17 shows another example of the configuration of the jitter measurement apparatus 400. According to the present embodiment, the jitter measurement apparatus 400 includes therein the pulse generator 410, first filter 420, DC component detecting section 430, adjusting section 440, and the semiconductor chip 462. The pulse generator 410, first filter 420, DC component detecting section 430, and adjusting section 440 may respectively have the same functions and configurations as the pulse generator 410, first filter 420, DC component detecting section 430, and adjusting section 440 which are illustrated with reference to one of FIGS. 13 and 14.

In the present embodiment, the pulse generator 410, first filter 420, and DC component detecting section 430 are provided on the semiconductor chip 462. Meanwhile, the adjusting section 440 is provided outside the semiconductor chip 462. Here, the semiconductor chip 462 includes therein an output terminal 470 and an input terminal 472.

The output terminal 470 outputs the DC component of the demodulated signal which is detected by the DC component detecting section 430 to the adjusting section 440 provided outside the semiconductor chip 462. The adjusting section 440 outputs a control signal determined in accordance with the difference between the DC component of the demodulated signal and the reference value supplied thereto. The input terminal inputs the control signal into the inside of the semiconductor chip 462, so as to adjust the pulse width of the pulse output from the pulse generator 410.

When the jitter measurement apparatus 400 is provided on the semiconductor chip 462, the adjusting section 440 is disposed outside the semiconductor chip 462 in the present embodiment as described above. In this manner, the setting of the adjusting section 440 can be easily conducted. For example, it becomes easy to adjust the reference value or the like supplied to the adjusting section 440. When a plurality of jitter measurement apparatuses 400 are provided in the semiconductor chip 462 in correspondence with the plurality of output pins of a device under test, the adjusting section 440 of each jitter measurement apparatus 400 may be disposed outside the semiconductor chip 462. In this manner, the setting of the adjusting sections 440 can be easily conducted.

Figure 18:
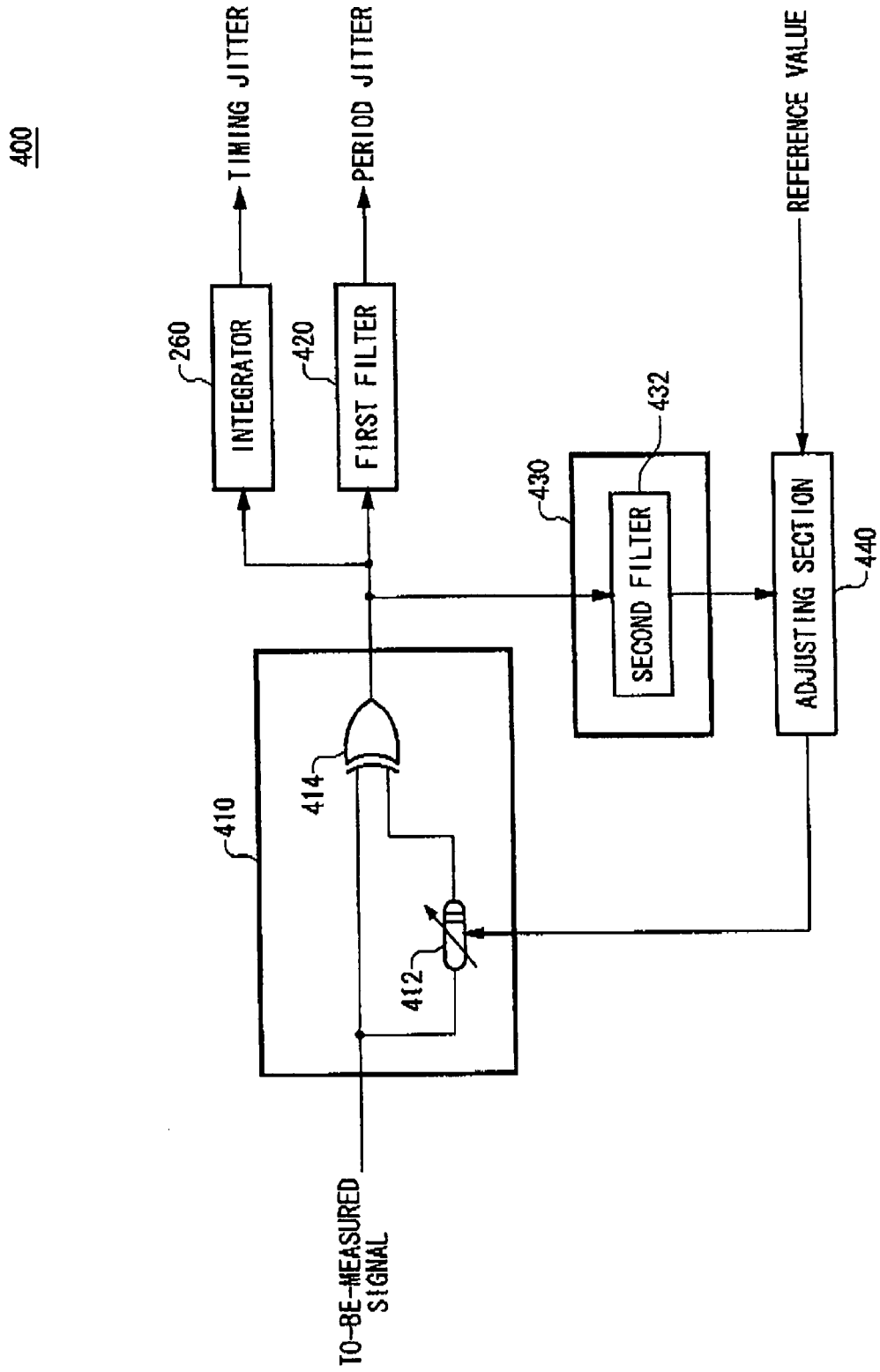
FIG. 18 shows another example of the configuration of the jitter measurement apparatus 400.

FIG. 18 shows another example of the configuration of the jitter measurement apparatus 400. According to the present embodiment, the jitter measurement apparatus 400 may include therein the integrator 260 in addition to the constituents of the jitter measurement apparatus 400 illustrated with reference to one of FIGS. 13 to 17. The integrator 260 integrates the pulses output from the pulse generator 410, to extract the timing jitter of the signal under measurement. The jitter measurement apparatus 400 may include the integrator 260 in place of the first filter 420. The integrator 260 may have the same function and configuration as the integrator 260 illustrated with reference to FIG. 11.

Figure 19A:
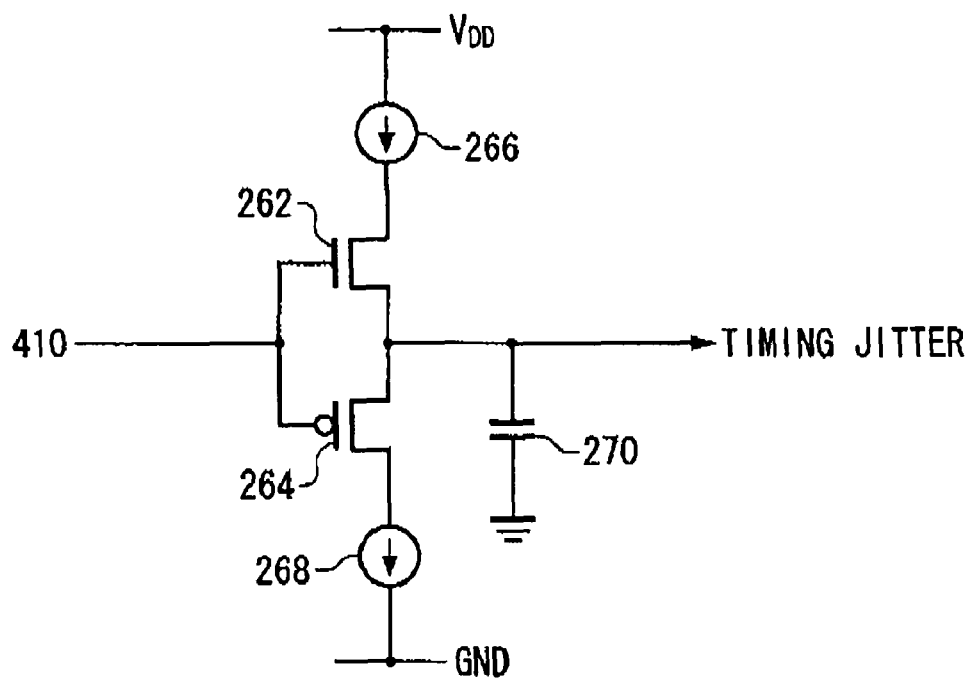
FIG. 19A shows one example of the configuration of an integrator 260.

FIG. 19A shows one example of the configuration of the integrator 260. The integrator 260 includes therein a source-side current source 266, a source-side transistor 262, a sink-side current source 268, a sink-side transistor 264, and a capacitor 270. The source-side transistor 262 charges the capacitor 270 with the source current generated by the source-side current source 266 while the demodulated signal output from the pulse generator 410 indicates an H logic. The sink-side transistor 264 discharges the capacitor 270 with the sink current generated by the sink-side current source 268 while the demodulated signal output from the pulse generator 410 indicates an L logic. Configured in the above-described manner, the integrator 260 can extract the timing jitter by detecting the variation in voltage of the capacitor 270.

Figure 19B:
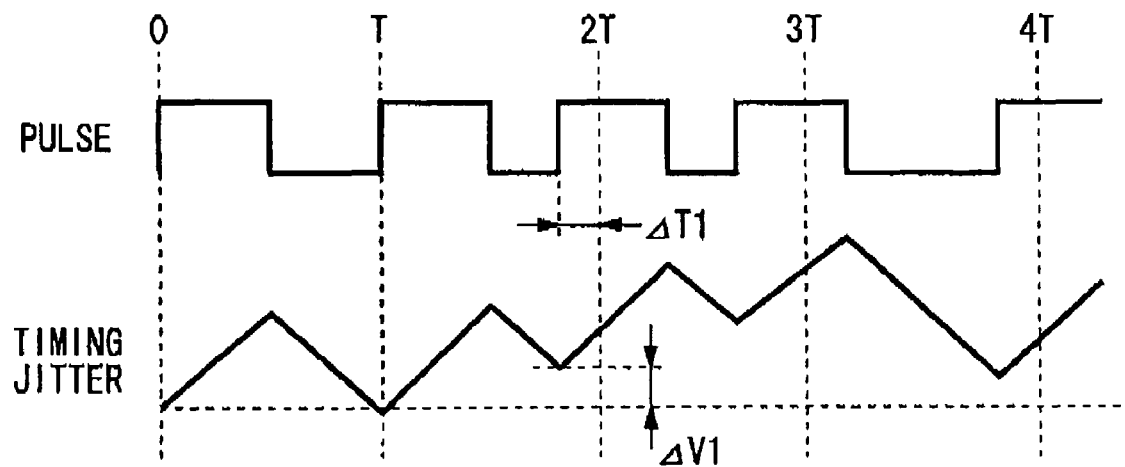
FIG. 19B is a timing chart illustrating one example of the operation performed by the integrator 260.

FIG. 19B is a timing chart showing one example of the operation of the integrator 260. In FIG. 19B, the boundaries between the cycles of the signal under measurement are shown as the times 0, T, 2T, 3T . . . . If the signal under measurement does not have jitter, the pulse generator 410 outputs a pulse in synchronization with the boundaries of the cycles of the signal under measurement, for example, the times 0 and T in FIG. 19B. In this case, the voltage of the capacitor 270 (timing jitter) becomes a predetermined reference level at the times 0 and T as shown in FIG. 19B. Note that the amount of the current generated by each of the source-side current source 266 and sink-side current source 268 may be set in such a manner that, when the signal under measurement does not have jitter, the voltage of the capacitor 270 becomes a substantially constant level at the boundaries between the cycles of the signal under measurement.

On the other hand, if the signal under measurement includes jitter therein, the pulse output from the pulse generator 410 has a difference in phase $\Delta T1$ with respect to the boundaries between the cycles of the signal under measurement which are observed when the signal under measurement includes no jitter, for example, with respect to the time 2T in FIG. 19B. The difference in phase $\Delta T1$ corresponds to the amount of timing jitter at this edge of the signal under measurement.

If such is the case, the discharging time period varies by $\Delta T1$. Therefore, the voltage of the capacitor 270 has a difference in voltage $\Delta V1$ corresponding to $\Delta T1$, with respect to the reference level. As a result, the voltage difference $\Delta V1$ corresponds to the amount of timing jitter at this edge of the signal under measurement. In other words, the integrator 260 converts the value of the jitter measured in terms of time into the value of the jitter measured in terms of voltage, and outputs the result of the conversion. Configured in the above-described manner, the integrator 260 can measure the timing jitter of each edge of the signal under measurement.

Figure 20:
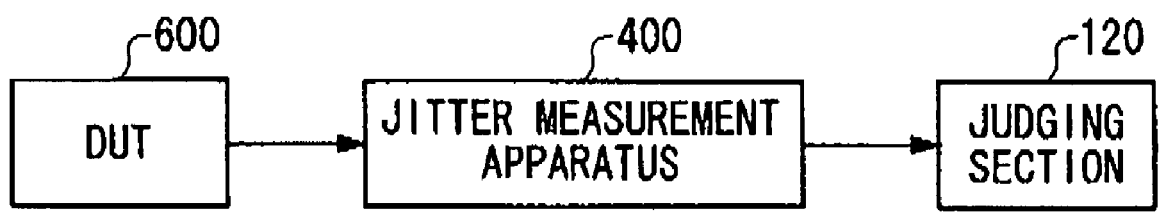
FIG. 20 shows one example of the configuration of a test apparatus 500 relating to another embodiment of the present invention.

FIG. 20 shows one example of the configuration of a test apparatus 500 relating to another embodiment of the present invention. The test apparatus 500 judges the pass/fail of a device under test 600 such as a semiconductor chip. The test apparatus 500 includes therein the jitter measurement apparatus 400 and the judging section 120. The judging section 120 may be the same as the judging section 120 illustrated with reference to FIG. 12.

The jitter measurement apparatus 400 may be the same as the jitter measurement apparatuses 400 illustrated with reference to FIGS. 13 to 19. The jitter measurement apparatus 400 measures jitter of a signal under measurement output from the device under test 600.

The judging section 120 judges the pass/fail of the device under test 600 based on the amount of jitter measured by the jitter measurement apparatus 400. For example, the judging section 120 may judge the pass/fail of the device under test 600 by determining whether the amount of jitter falls within a predetermined permissible range.

The test apparatus 500 relating to the present embodiment can accurately measure the jitter of the signal under measurement in spite of a temperature variation and the like. Consequently, the test apparatus 500 can accurately test the device under test 600.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

What is claimed is:
1. A jitter measurement apparatus to measure jitter of a signal under measurement, comprising:
   a pulse generator that outputs a pulse signal indicating the jitter of the signal under measurement, by outputting the pulse having a substantially constant pulse width in syn- chronization with each rising edge, each falling edge or both rising edges or falling edges of the signal under measurement;
a DC component detecting section that detects a DC component of the pulse signal output from the pulse generator; and
an adjusting section that is coupled to the pulse generator to adjust the pulse width of the pulse output from the pulse generator, based on the DC component of the pulse signal which is detected by the DC component detecting section wherein the adjusting section adjusts the pulse width of the pulse signal output from the pulse generator so that the DC component of the pulse signal substantially coincides with a predetermined reference value.

2. The jitter measurement apparatus as set forth in claim 1, further comprising:
a first filter that receives the pulse signal output from the pulse generator, and outputs a period jitter component of the pulse signal by removing a carrier frequency component of the signal under measurement,
wherein the DC component detecting section includes therein a second filter that receives the pulse signal output from the pulse generator, and passes the DC component of the pulse signal, and
the adjusting section adjusts the pulse width of the pulse signal output from the pulse generator based on a difference between a level of the DC component of the pulse signal which is passed by the second filter and a level of the reference value.

3. The jitter measurement apparatus as set forth in claim 2, wherein the first and second filters are respectively low-pass filters, and the first filter has a higher cut off frequency than the second filter.

4. The jitter measurement apparatus as set forth in claim 1, further comprising:
a first filter that receives the pulse signal output from the pulse generator, and outputs a period jitter component of the pulse signal by removing a carrier frequency component of the signal under measurement,
wherein the DC component detecting section includes therein a second filter that receives a demodulated signal output from the first filter, and passes the DC component of the pulse signal, and
the adjusting section adjusts the pulse width of the pulse signal output from the pulse generator based on a difference between a level of the DC component of the pulse signal which is passed by the second filter and a level of the reference value.

5. The jitter measurement apparatus as set forth in claim 2, wherein the pulse generator and DC component detecting section are provided on a semiconductor chip, and the adjusting section is provided outside the semiconductor chip.

6. The jitter measurement apparatus as set forth in claim 1, wherein the pulse generator and DC component detecting section are provided on a semiconductor chip, and the jitter measurement apparatus further comprises two series resistances that are provided in series within the semiconductor chip between positive and negative power supply wires, the two series resistances dividing positive and negative power supply voltages by a predetermined resistance ratio, thereby generating the reference value.

7. The jitter measurement apparatus as set forth in claim 1, wherein the adjusting section includes:
a differential amplifier that outputs, to the pulse generator, a voltage determined in accordance with a difference between the reference value and the DC component of the pulse signal which is output from the DC component detecting section; and
a capacitor that is provided between a ground potential and a transmission path which connects the differential amplifier and the pulse generator to each other.

8. The jitter measurement apparatus as set forth in claim 1, further comprising a differential circuit that supplies, to the adjusting section, a difference between a level of the DC component of the pulse signal which is output from the DC component detecting section and a level of the pulse signal output from the pulse generator which is observed when the pulse signal indicates a logical value '0', as the level of the DC component of the pulse signal.

9. An electronic device having the jitter measurement apparatus as set forth in claim 1 provided therein.

10. An electronic device including therein a jitter measurement apparatus to measure jitter of a signal under measurement, wherein the jitter measurement apparatus includes:
a pulse generator that outputs a pulse signal indicating the jitter of the signal under measurement, by outputting a pulse signal having a substantially constant pulse width in synchronization with each rising edge, each falling edge or both rising edges or falling edges of the signal under measurement; and
a DC component detecting section that detects a DC component of the pulse signal output from the pulse generator, and the electronic device includes:
an output terminal that outputs the DC component of the pulse signal which is detected by the DC component detecting section, to an adjusting section that is provided outside the electronic device; and
an input terminal that inputs a control signal output from the adjusting section into inside of the electronic device so as to adjust the pulse width of the pulse signal output from the pulse generator, the control signal being determined in accordance with a difference between a predetermined reference value and a level of the DC component of the pulse signal.

11. A test apparatus for testing a device under test comprising:
a jitter measurement apparatus to measure jitter of a signal output from the device under test;
a judging section which judges a pass or fail of the device under test by comparing the jitter amount measured by the jitter measurement apparatus with a predetermined value used for judging,
wherein the jitter measurement apparatus comprises:
a pulse generator that outputs a pulse signal indicating the jitter of the signal under measurement, by outputting a pulse signal having a substantially constant pulse width in synchronization with each rising edge, each falling edge or both rising edges or falling edges of the signal under measurement;
a DC component detecting section that detects a DC component of the pulse signal output from the pulse generator; and
an adjusting section that is coupled to the pulse generator to adjust the pulse width of the pulse signal output from the pulse generator, based on the DC component of the pulse signal which is detected by the DC component detecting section.

\* \* \* \* \*